(12) United States Patent
Ryu et al.

(10) Patent No.: US 11,967,670 B2
(45) Date of Patent: Apr. 23, 2024

(54) DISPLAY DEVICE

(71) Applicant: Samsung Display Co., LTD., Yongin-si (KR)

(72) Inventors: An Na Ryu, Hwaseong-si (KR); Sung Hoon Kim, Seoul (KR); Sang Ho Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 453 days.

(21) Appl. No.: 17/177,848

(22) Filed: Feb. 17, 2021

(65) Prior Publication Data
US 2021/0257525 A1 Aug. 19, 2021

(30) Foreign Application Priority Data
Feb. 19, 2020 (KR) .................... 10-2020-0020356

(51) Int. Cl.
*H01L 33/62* (2010.01)
*H01L 27/15* (2006.01)
*H01L 33/38* (2010.01)

(52) U.S. Cl.
CPC ............ *H01L 33/62* (2013.01); *H01L 27/156* (2013.01); *H01L 33/38* (2013.01)

(58) Field of Classification Search
CPC ....... H01L 33/62; H01L 27/156; H01L 33/38; H01L 25/0753; H01L 25/167; H01L 21/28; H01L 21/76895; H01L 25/105; H01L 27/124; H10K 59/1213; H10K 59/123; H10K 59/1315; H10K 59/122
See application file for complete search history.

(56) References Cited

U.S. PATENT DOCUMENTS

| | | | |
|---|---|---|---|
| 2007/0242206 A1* | 10/2007 | Yoon ................ | G02F 1/134363 349/141 |
| 2014/0253811 A1* | 9/2014 | Koyama ............. | G09G 3/2022 348/725 |
| 2016/0329394 A1* | 11/2016 | Asano ............... | H10K 59/1216 |
| 2017/0227826 A1* | 8/2017 | Heo .................. | G02F 1/136227 |
| 2017/0309227 A1* | 10/2017 | Ebisuno ............. | H10K 59/131 |

(Continued)

FOREIGN PATENT DOCUMENTS

| KR | 10-0509382 | 8/2005 |
|---|---|---|
| KR | 10-1119172 | 3/2012 |

(Continued)

*Primary Examiner* — Victor A Mandala
(74) *Attorney, Agent, or Firm* — KILE PARK REED & HOUTTEMAN PLLC

(57) ABSTRACT

A display device includes a first pixel and a second pixel adjacent to each other in a first direction, first voltage wires disposed in the first pixel and the second pixel in a second direction, a second wire disposed along a boundary between the first pixel and the second pixel in the second direction, first electrodes disposed between the first voltage wires and the second wire in the first pixel an the second pixel, a second electrode disposed between and spaced apart from the first electrodes in the first pixel and the second pixel, and light-emitting elements disposed at each of the first pixel and the second pixel and disposed on the first electrodes and the second electrode, wherein the first voltage wires, the first electrodes, and the light-emitting elements are symmetric with respect to the second wire.

23 Claims, 18 Drawing Sheets

(56) References Cited

U.S. PATENT DOCUMENTS

| | | | | |
|---|---|---|---|---|
| 2017/0352312 | A1* | 12/2017 | Ebisuno | H10K 59/35 |
| 2018/0197898 | A1* | 7/2018 | Luo | H01L 29/42392 |
| 2018/0366491 | A1* | 12/2018 | Zang | G02F 1/136227 |
| 2019/0035812 | A1* | 1/2019 | Zhang | H01L 27/1244 |
| 2020/0013841 | A1* | 1/2020 | Lee | H01L 25/167 |
| 2020/0119244 | A1* | 4/2020 | Kwon | H01L 33/62 |
| 2020/0185417 | A1* | 6/2020 | Cheng | H01L 27/1255 |
| 2020/0193928 | A1* | 6/2020 | Kawashima | G02F 1/13624 |
| 2021/0057482 | A1* | 2/2021 | Kong | H01L 33/36 |
| 2022/0068901 | A1* | 3/2022 | Kong | H01L 27/124 |
| 2022/0077227 | A1* | 3/2022 | Kang | G09G 3/32 |
| 2022/0102331 | A1* | 3/2022 | Do | H01L 25/167 |
| 2022/0139319 | A1* | 5/2022 | Oh | H01L 25/0753 |
| | | | | 345/204 |

FOREIGN PATENT DOCUMENTS

| | | |
|---|---|---|
| KR | 10-2017-0026953 | 3/2017 |
| KR | 10-2017-0116633 | 10/2017 |
| KR | 10-2019-0041697 | 4/2019 |

* cited by examiner

DISPLAY DEVICE

CROSS-REFERENCE TO RELATED APPLICATION(S)

This application claims priority to and benefits of Korean Patent Application No. 10-2020-0020356 under 35 U.S.C. § 119, filed on Feb. 19, 2020 in the Korean Intellectual Property Office, the entire contents of which are incorporated herein by reference.

BACKGROUND

1. Technical Field

The disclosure relates to a display device.

2. Description of the Related Art

Display devices have increasingly become important with the development of multimedia, and various types of display devices, such as an organic light-emitting diode (OLED) display device, a liquid crystal display (LCD) device, or the like, have been used.

A display device, which is a device that may display an image, may include a display panel such as an OLED display panel or an LCD panel. The display panel may include light-emitting elements such as light-emitting diodes (LEDs), and the LEDs may be classified into OLEDs using an organic material as a fluorescent material and inorganic LEDs using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including inorganic light-emitting elements.

Embodiments also provide a display device that may include pixels that may share the same voltage line(s).

However, embodiments are not restricted to those set forth herein. The above and other embodiments will become more apparent to one of ordinary skill in the art to which the disclosure pertains by referencing the detailed description of the disclosure given below.

According to an embodiment, a display device may include a first pixel and a second pixel disposed adjacent to each other in a first direction; first voltage wires disposed in the first pixel and the second pixel in a second direction; a second wire disposed along a boundary between the first pixel and the second pixel in the second direction; first electrodes disposed between the first voltage wires and the second wire in the first pixel and the second pixel; a second electrode disposed between and spaced apart from the first electrodes in the first pixel and the second-pixel; and light-emitting elements disposed at each of the first pixel and the second pixel and disposed on the first electrodes and the second electrode, wherein the first voltage wires, the first electrodes, and the light-emitting elements may be disposed symmetric with respect to the second wire.

The first pixel and the second pixel may include first transistors overlapping the light-emitting elements in a thickness direction, and the first transistors may be symmetric with respect to the second wire.

A distance between the light-emitting elements may differ from a distance between the first voltage wires.

The display device may further comprise data lines disposed in the first pixel and the second pixel and extending in the second direction, wherein the first voltage wires may be disposed between the data lines and the second wire.

The first pixel and the second pixel may include second transistors which may be electrically connected to the data lines.

The display device may further include a first wire extending in the first direction across the first pixel and the second pixel, wherein the second wire may extend in the second direction to intersect the first wire.

At least part of the second wire may protrude toward the first electrode of the first pixel and the first electrode of the second pixel and overlaps a portion of the second electrode; and the first wire and the second wire may be disposed in different layers and may be electrically connected via a contact hole that may be formed in an overlapping portion of the first wire and the second wire.

The first pixel and the second pixel may include third transistors disposed between the first wire and the first transistors.

The first wire may include a wire stem portion; and a wire extension portion protruding in the second direction beyond the wire stem portion, and the wire extension portion may overlap the third transistors in a thickness direction.

The display device may further comprise a shielding member spaced apart from the first wire and overlapping the third transistors in a thickness direction, wherein the shielding member and the first wire may be disposed on a same layer.

The first electrodes may be electrically connected to the shielding member.

The first electrodes and the second electrode may extend in the second direction, and lengths of the first electrodes and the second electrode in the second direction may be greater than a length of the light-emitting elements in the second direction.

A number of light-emitting elements disposed on the first and second electrodes of the first pixel may be greater than a number of light-emitting elements disposed on the first and second electrodes of the second pixel.

The display device may further comprise first pad electrodes disposed on the first electrodes; and a second pad electrode disposed on the second electrode, wherein the light-emitting elements may be in contact with the first pad electrodes and the second pad electrode.

According to an embodiment, a display device may include first voltage wires spaced apart from one another in a first direction and extending in a second direction; a second voltage wire disposed between the first voltage wires to extend in the second direction; first electrodes disposed between the second voltage wire and the first voltage wires; a wire extension portion spaced apart from the first electrodes, the wire extension portion being at least a portion of the second voltage wire that protruding toward the first electrodes; and light-emitting elements disposed on the first electrodes and disposed on the wire extension portion, wherein a distance between the light-emitting elements may differ from a distance between the first voltage wires.

The second voltage wire may include a first wire extending in the first direction; and a second wire extending in the second direction to intersect the first wire, and the wire extension portion may be formed in the second wire.

A length of the wire extension portion in the second direction may be same as a length of the first electrodes in the second direction.

The display device may further comprise first pad electrodes disposed on the first electrodes; and a second pad electrode disposed on the wire extension portion, wherein the light-emitting elements may directly contact the first pad electrodes and the second pad electrode.

The first wire and the second wire may be disposed in different layers and may be electrically connected via a contact hole that may be formed in an overlapping portion of the first wire and the second wire.

The first wire and the second wire may be formed of conductive layers that may be disposed on a same layer.

According to the aforementioned and other embodiments, since a display device may include electrodes having a large width, heat generated from light-emitting elements may be effectively released.

In addition, the same voltage wires may be shared by pairs of adjacent pixels, and wires and elements may be arranged or disposed symmetrically with respect to the voltage wires. Since the display device may include multiple pixels sharing the same voltage wires and an electrode structure and a heat dissipation pattern that may discharge heat from each of the pixels, heat generated by the light-emitting elements may be further effectively released.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
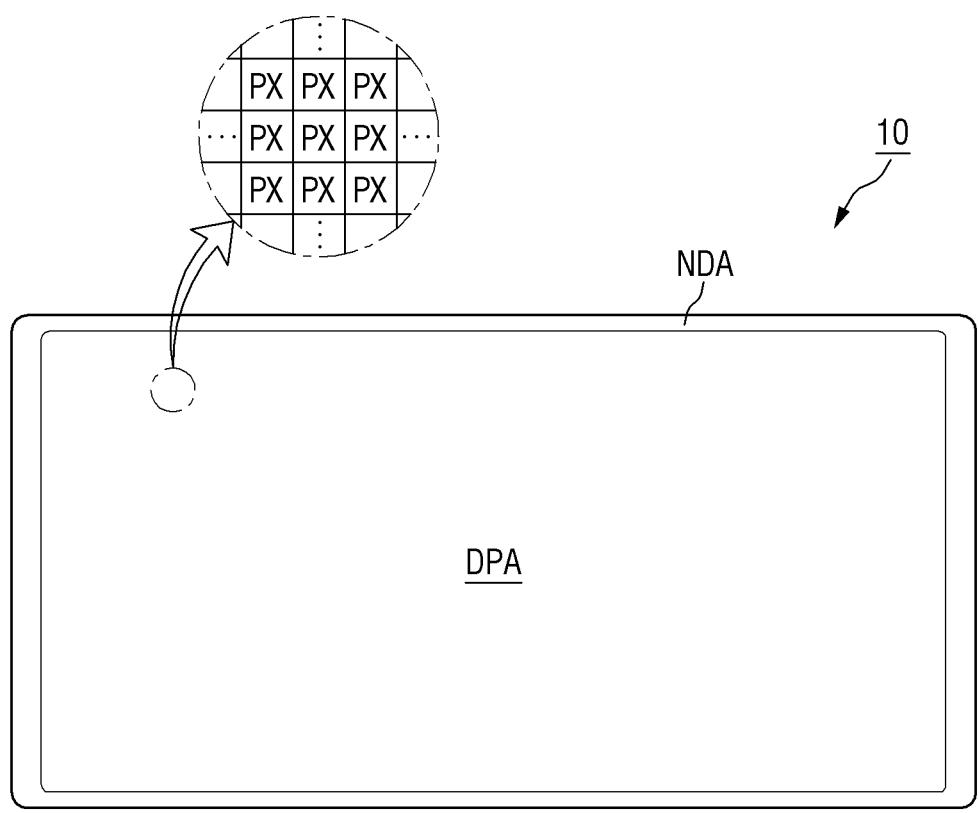
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the drawings.

FIG. 1 is a plan view of a display device according to an embodiment.

Referring to FIG. 1, a display device 10 may be applicable to various electronic devices such as a small- or mid-size electronic device (for example, a tablet personal computer (PC), a smartphone, a navigation device, a camera, a center information display (CID) for a vehicle, a wristwatch-type electronic device, a personal digital assistant (PDA), a portable multimedia player (PMP), or a gaming console) or a mid- or large-size electronic device such as a television (TV), an outdoor billboard, a monitor, a PC, or a laptop computer, but the disclosure is not limited thereto. The display device 10 may also be applicable to other electronic devices than those set forth herein within the spirit and the scope of the disclosure.

The display device 10 may include a display panel that may provide a display screen. Examples of the display panel include an inorganic light-emitting diode (LED) display panel, an organic LED display panel, a quantum-dot LED display panel, a plasma display panel (PDP), and a field emission display (FED) panel. The display panel of the display device 10 will hereinafter be described as being an inorganic LED display panel, but the disclosure is not limited thereto.

The shape of the display device 10 may vary. For example, the display device 10 may have a substantially rectangular shape that may extend longer in a horizontal direction than in a vertical direction, a substantially rectangular shape that may extend longer in the vertical direction than in the horizontal direction, a substantially square shape, a substantially rectangular shape with rounded corners, another substantially polygonal shape, or a substantially circular shape. A display area DPA of the display device 10 may have a similar shape to the display device 10. FIG. 1 illustrates that the display device 10 and the display area DPA have a substantially rectangular shape that extends longer in the horizontal direction than in the vertical direction.

The display device 10 may include a pair of first sides that may extend in a first direction and a pair of second sides that may extend in a second direction that may intersect the first direction. The corners where the first sides and the second sides of the display device 10 meet may be right-angled, but the disclosure is not limited thereto. Alternatively, the corners where the first sides and the second sides of the display device 10 meet may be rounded. In an embodiment, the first sides may be shorter than the second sides, but the disclosure is not limited thereto. The planar shape of the display device 10 is not particularly limited, and the display device 10 may have various shapes other than those set forth herein, such as a substantially circular shape.

The display device 10 may include the display area DPA and a non-display area NDA. The display area DPA may be an area in which a screen may be displayed, and the non-display area NDA may be an area in which a screen may not be displayed. The display area DPA may also be referred to as an active area, and the non-display area NDA may also be referred to as an inactive area. The display area DPA may generally account for a middle portion or region of the display device 10.

The display area DPA may include pixels PX. The pixels PX may be arranged or disposed in row and column directions. The pixels PX may have a substantially rectangular or square shape in a plan view, but the disclosure is not limited thereto. Alternatively, the pixels PX may have a substantially rhombus shape that may be inclined with respect to the first or second direction. The pixels PX may be alternately arranged or disposed in a stripe fashion or a PenTile fashion. Each of the pixels PX may include one or more light-emitting elements 300 that may emit light of a predetermined wavelength range to emit light of a predetermined color.

The non-display area NDA may be disposed on the periphery of the display area DPA. The non-display area NDA may surround or may be adjacent to the entire display area DPA or portion or a region of the display area DPA. The display area DPA may have a substantially rectangular shape, and the non-display area NDA may be disposed adjacent to four sides of the display area DPA. The non-display area NDA may form the bezel of the display device 10. In the non-display area NDA, wires or circuit drivers included in the display device 10 may be disposed, or external devices may be mounted.

Figure 2:
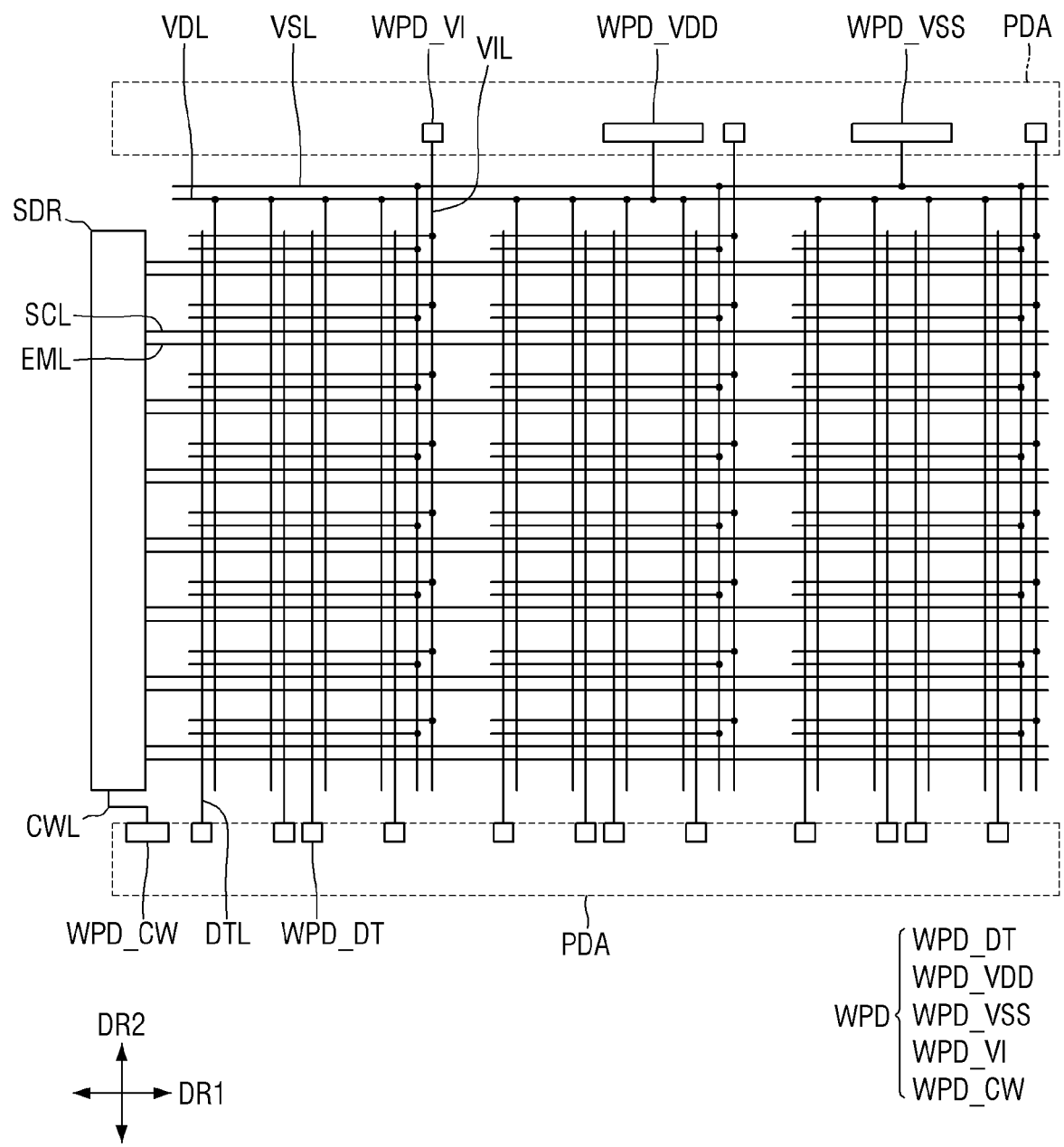
FIG. 2 is a layout view illustrating wires included in the display device of FIG. 1.

FIG. 2 is a layout view illustrating wires included in the display device of FIG. 1.

Referring to FIG. 2, the display device 10 may include wires. The wires may include scan lines SCL, emission control lines EML, data lines DTL, initialization voltage wires VIL, first voltage wires VDL, and second voltage wires VSL. Although not illustrated, the display device 10 may include other wires. FIG. 2 illustrates the schematic arrangement of the wires.

The scan lines SCL and the emission control lines EML may extend in a first direction DR1. The scan lines SCL and the emission control lines EML may be electrically connected to a driving unit SDR. The driving unit SDR may include a scan driving circuit and an emission signal control circuit. The driving unit SDR may be disposed in the non-display area NDA, on a side, in the first direction DR1, of the display area DPA, but the disclosure is not limited thereto. Alternatively, in an embodiment, two driving units SDR may be provided or disposed in the non-display area NDA, on both sides, in the first direction DR1, of the display area DPA, in which case, one of the two driving units SDR may include a scan driving circuit and the other driving unit SDR may include an emission signal control circuit. The scan lines SCL may be electrically connected to the driving unit SDR including the scan driving circuit, and the emission control lines EML may be electrically connected to the driving unit SDR including the emission signal control circuit. The driving unit SDR may be electrically connected to a signal connecting line CWL, and at least one end of the signal connecting line CWL may form a pad WPD_CW in the non-display area NDA and may thus be electrically connected to an external device.

The data lines DTL may extend in a second direction DR2 that may intersect the first direction DR1. The initialization voltage wires VIL may include portions that may extend in the second direction DR2 and portions that may branch off in the first direction DR1 from the portions that may extend in the second direction DR2. The first voltage wires VDL and the second voltage wires VSL may include portions that may extend in the first direction DR1 and portions that may branch off in the second direction DR2 from the portions that may extend in the first direction DR1. The first voltage wires VDL and the second voltage wires VSL may have a mesh structure, but the disclosure is not limited thereto. Although not illustrated, each of the pixels PX of the display device 10 may be electrically connected to at least one of the scan lines SCL, one of the data lines DTL, one of the emission control lines EML, one of the initialization voltage wires VIL, one of the first voltage wires VDL, and one of the second voltage wires VSL.

The data lines DTL, the initialization voltage wires VIL, the first voltage wires VDL, and the second voltage wires VSL may be electrically connected to one or more wire pads WPD. The wire pads WPD may be disposed in the non-display area NDA. In an embodiment, wire pads WPD_DT (hereinafter, the data pads WPD_DT) of the data lines DTL may be disposed in a pad area PDA on a side, in the second direction DR2, of the display area DPA, and wire pads WPD_VI (hereinafter, the initialization voltage pads WPD_VI) of the initialization voltage wires VIL, wire pads WPD_VDD (hereinafter, the first power supply pads WPD_VDD) of the first voltage wires VDL, and wire pads WPD_VSS (hereinafter, the second power supply pads WPD_VSS) of the second voltage wires VSL may be disposed in a pad area PDA on another side, in the second direction DR2, of the display area DPA. In an embodiment, the data pads WPD_DT, the initialization voltage pads WPD_VI, the first power supply pad WPD_VDD, and the second power supply pad WPD_VSS may all be disposed in the same area, for example, in a portion or region of the non-display area NDA on an upper side of the display area DPA. An external device may be mounted on the wire pads WPD. The external device may be mounted on the wire pads WPD via an anisotropic conductive film or through ultrasonic bonding.

The pixels PX of the display device 10 may include pixel driving circuits. The wires of the display device 10 may pass through, or pass by, the pixels PX to apply driving signals to the pixel driving circuits of the pixels PX. Each of the pixel driving circuits of the pixels PX may include transistors and capacitors. The numbers of transistors and capacitors in each of the pixel driving circuits of the pixels PX may vary. The pixels PX will hereinafter be described as having a "7T1C" structure including seven transistors and one capacitor, but the disclosure is not limited thereto. Various other pixel configurations such as "2T1C", "3T1C", and "6T1C" structures may also be applicable to the pixels PX.

Figure 3:
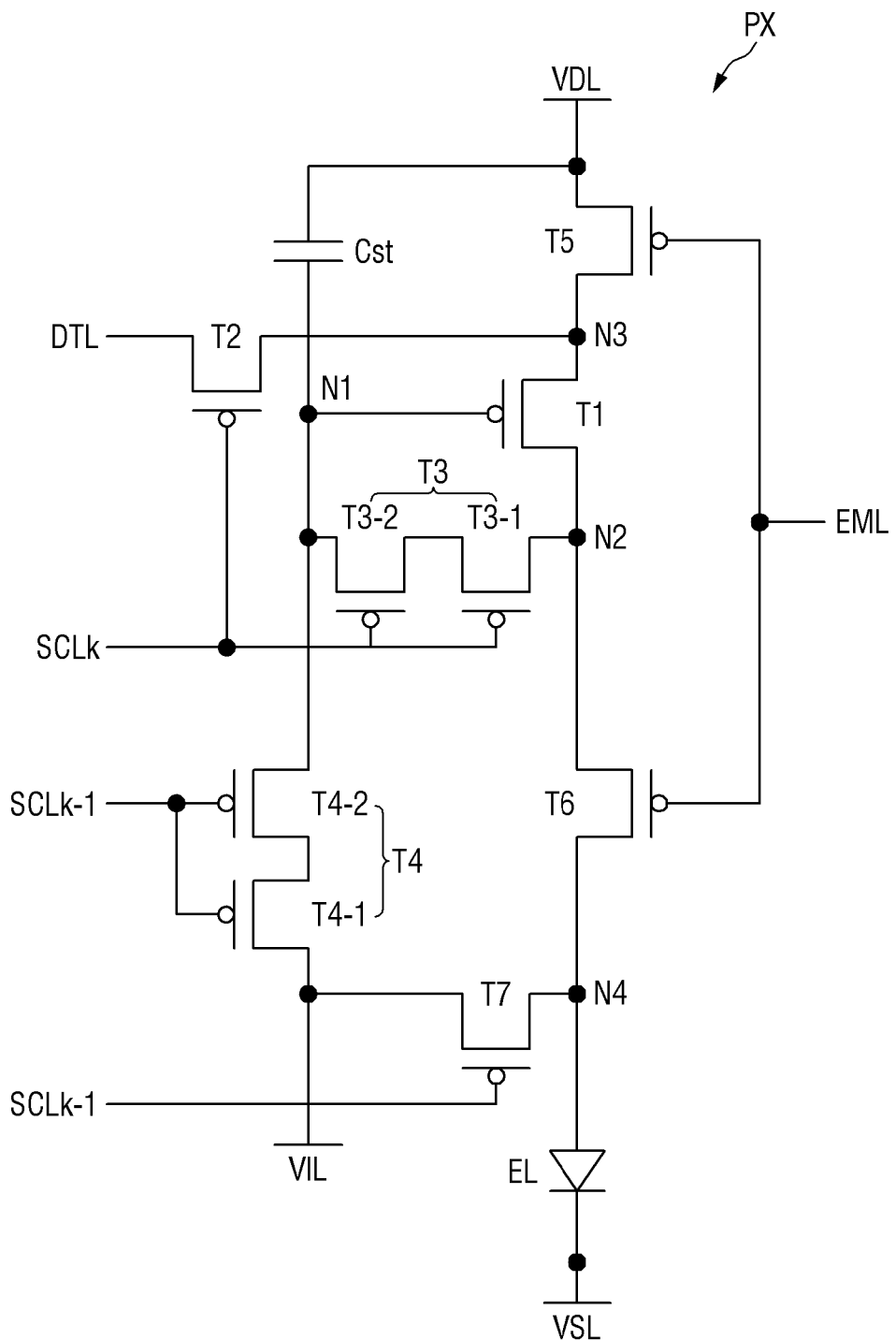
FIG. 3 is an equivalent circuit diagram of a pixel of the display device of FIG. 1.

FIG. 3 is an equivalent circuit diagram of a pixel of the display device of FIG. 1.

Referring to FIG. 3, a pixel PX, arranged or disposed in a k-th row (where k is an integer of 1 or greater) and a j-th column (where j is an integer of 1 or greater), may be electrically connected to a k-th scan line SCLk, a (k−1)-th scan line SCLk−1, a k-th emission control line EML, a j-th data line DTL, a first voltage wire VDL, a second voltage wire VSL, and an initialization voltage wire VIL.

The pixel PX may include an LED "EL", first through seventh transistors T1 through T7, and a storage capacitor Cst. The first transistor T1 may be a driving transistor, and the second through seventh transistors T2 through T7 may be switching transistors.

In an embodiment, the first through seventh transistors T1 through T7 may be formed as thin-film transistors (TFTs). FIG. 3 illustrates that the first through seventh transistors T1 through T7 may be P-type metal-oxide semiconductor field-effect transistors (MOSFETs), but the disclosure is not limited thereto. Alternatively, the first through seventh transistors T1 through T7 may be formed as N-type MOSFETs. Yet alternatively, some or a predetermined number of the first through seventh transistors T1 through T7 may be formed as P-type MOSFETs, and the other transistors may be formed as N-type MOSFETs.

The first transistor T1 may include a gate electrode, a source electrode, and a drain electrode. The first transistor T1 may be a driving transistor that may control a source-drain current (or a driving current) in accordance with a data signal applied to the gate electrode thereof. The gate electrode of the first transistor T1 may be electrically connected to a first node N1, a first end of the first transistor T1 may be electrically connected to a third node N3, and a second end of the first transistor T1 may be electrically connected to a second node N2. For example, the source electrode of the first transistor T1 may be electrically connected to the third node N3, and the drain electrode of the first transistor T1 may be electrically connected to the second node N2. However, the disclosure is not limited to this example. Alternatively, in a case where the first transistor T1 may be an N-type MOSFET, the source electrode and the drain electrode of the first transistor T1 may be electrically connected to the second node N2 and the third node N3, respectively. The first through seventh transistors T1 through T7 will hereinafter be described as being P-type MOSFETs having source electrodes as their first ends and drain electrodes as their second ends.

The LED "EL" may emit light in accordance with a driving current supplied thereto via the first transistor T1. In an embodiment, the LED "EL" may be an inorganic LED including a first electrode, a second electrode, and a light-emitting element (300 of FIG. 6). The light-emitting element 300 may emit light of a particular wavelength range in accordance with an electrical signal transmitted from the first electrode to the second electrode.

A first end of the LED "EL" may be electrically connected to a fourth node N4. The first end of the LED "EL" may be electrically connected to the drain electrodes of the sixth and seventh transistors T6 and T7 via the fourth node N4. A second end of the LED "EL" may be electrically connected to the second voltage wire VSL to which a low-potential voltage (for example, a second power supply voltage), which may be lower than a high-potential voltage (for example, a first power supply voltage) provided to the first voltage wire VDL, may be applied.

The second transistor T2 may be turned on by a k-th scan signal from the k-th scan line SCLk to electrically connect the j-th data line DTL and the third node N3, which may be the source electrode of the first transistor T1. The second transistor T2 may be turned on by the k-th scan signal to apply a data signal to the third node N3. The gate electrode of the second transistor T2 may be electrically connected to the k-th scan line SCLk, the source electrode of the second transistor T2 may be electrically connected to the j-th data line DTL, and the drain electrode of the second transistor T2 may be electrically connected to the third node N3. The drain electrode of the second transistor T2 may be electrically connected to the source electrode of the first transistor T1 and the drain electrode of the fifth transistor T5 via the third node N3.

The third transistor T3 may be turned on by the k-th scan signal to electrically connect the second node N2, which may be the drain electrode of the first transistor T1, and the first node N1, which may be the gate electrode of the first transistor T1. For example, the third transistor T3 may be a dual transistor including (3-1)- and (3-2)-th transistors T3-1 and T3-2. The gate electrode of the (3-1)-th transistor T3-1 may be electrically connected to the k-th scan line SCLk, the source electrode of the (3-1)-th transistor T3-1 may be electrically connected to the second node N2, and the drain electrode of the (3-1)-th transistor T3-1 may be electrically connected to the source electrode of the (3-2)-th transistor T3-2. The gate electrode of the (3-2)-th transistor T3-2 may be electrically connected to the k-th scan line SCLk, the source electrode of the (3-2)-th transistor T3-2 may be electrically connected to the drain electrode of the (3-1)-th transistor T3-1, and the drain electrode of the (3-2)-th transistor T3-2 may be electrically connected to the first node N1.

The fourth transistor T4 may be turned on by a (k−1)-th scan signal from the (k−1)-th scan line SCLk−1 to electrically connect the initialization voltage wire VIL and the first node N1, which may be the gate electrode of the first transistor T1. For example, the fourth transistor T4 may be a dual transistor including (4-1)- and (4-2)-th transistors T4-1 and T4-2. The (4-1)- and (4-2)-th transistors T4-1 and T4-2 may be turned on by the (k−1)-th scan signal to discharge the voltage of the gate electrode of the first transistor T1 to an initialization voltage VI. The gate electrode of the (4-1)-th transistor T4-1 may be electrically connected to the (k−1)-th scan line SCLk−1, the source electrode of the (4-1)-th transistor T4-1 may be electrically connected to the initialization voltage wire VIL, and the drain electrode of the (4-1)-th transistor T4-1 may be electrically connected to the source electrode of the (4-2)-th transistor T4-2. The gate electrode of the (4-2)-th transistor T4-2 may be electrically connected to the (k−1)-th scan line SCLk−1, the source electrode of the (4-2)-th transistor T4-2 may be electrically connected to the drain electrode of the (4-1)-th transistor T4-1, and the drain electrode of the (4-2)-th transistor T4-2 may be electrically connected to the first node N1.

The fifth transistor T5 may be turned on by an emission signal from the k-th emission control line EML to electrically connect the first voltage wire VDL and the third node N3, which may be the source electrode of the first transistor T1. The gate electrode of the fifth transistor T5 may be electrically connected to the k-th emission control line EML, the source electrode of the fifth transistor T5 may be electrically connected to the first voltage wire VDL, and the drain electrode of the fifth transistor T5 may be electrically connected to the third node N3. The drain electrode of the fifth transistor T5 may be electrically connected to the source electrode of the first transistor T1 and the drain electrode of the second transistor T2 via the third node N3.

The sixth transistor T6 may be turned on by the emission signal to electrically connect the second node N2, which may be the drain electrode of the first transistor T1, and the fourth node N4, which may be the first end of the LED "EL". The gate electrode of the sixth transistor T6 may be electrically connected to the k-th emission control line EML, the source electrode of the sixth transistor T6 may be electrically connected to the second node N2, and the drain electrode of the sixth transistor T6 may be electrically connected to the fourth node N4. The source electrode of the sixth transistor T6 may be electrically connected to the drain electrode of the first transistors T1 and the source electrode of the (3-1)-th transistor T3-1 via the second node N2. The drain electrode of the sixth transistor T6 may be electrically connected to the first end of the LED "EL" and the drain electrode of the seventh transistor T7 via the fourth node N4.

In a case that the fifth transistor T5, the first transistor T1, and the sixth transistor T6 are all turned on, a driving current may be supplied to the LED "EL".

The seventh transistor T7 may be turned on by the (k−1)-th scan signal to electrically connect the initialization voltage wire VIL and the fourth node N4, which may be the first end of the LED "EL". The seventh transistor T7 may be turned on by the (k−1)-th scan signal to discharge the voltage of the first end of the LED "EL" to the initialization voltage VI. The gate electrode of the seventh transistor T7 may be electrically connected to the (k−1)-th scan line SCLk−1, the source electrode of the seventh transistor T7 may be electrically connected to the initialization voltage wire VIL, and the drain electrode of the seventh transistor T7 may be electrically connected to the fourth node N4. The drain electrode of the seventh transistor T7 may be electrically connected to the first end of the LED "EL" and the drain electrode of the sixth transistor T6 via the fourth node N4. In an embodiment, the seventh transistor T7 may be electrically connected to the k-th scan line SCLk.

In an embodiment, each of the first through seventh T1 through T7 transistors may include a silicon (Si)-based active layer. For example, each of the first through seventh T1 through T7 transistors may include an active layer formed of low-temperature polycrystalline silicon (LTPS). The active layer formed of LTPS may have high electron mobility and excellent turn-on characteristics. Since the display device 10 may include the first through seventh T1 through T7 transistors, which have excellent turn-on characteristics, the display device 10 may stably and efficiently drive the pixels PX.

The storage capacitor Cst may be electrically connected between the first node N1, which may be the gate electrode of the first transistor T1, and the first voltage wire VDL. For example, a first capacitor electrode of the storage capacitor Cst may be electrically connected to the first node N1, and a second capacitor electrode of the storage capacitor Cst may be electrically connected to the first voltage wire VDL. Thus, the difference in electrical potential between the first voltage wire VDL and the gate electrode of the first transistor T1 may be maintained.

The structure of the pixels PX of the display device 10 will hereinafter be described in further detail.

Figure 4:
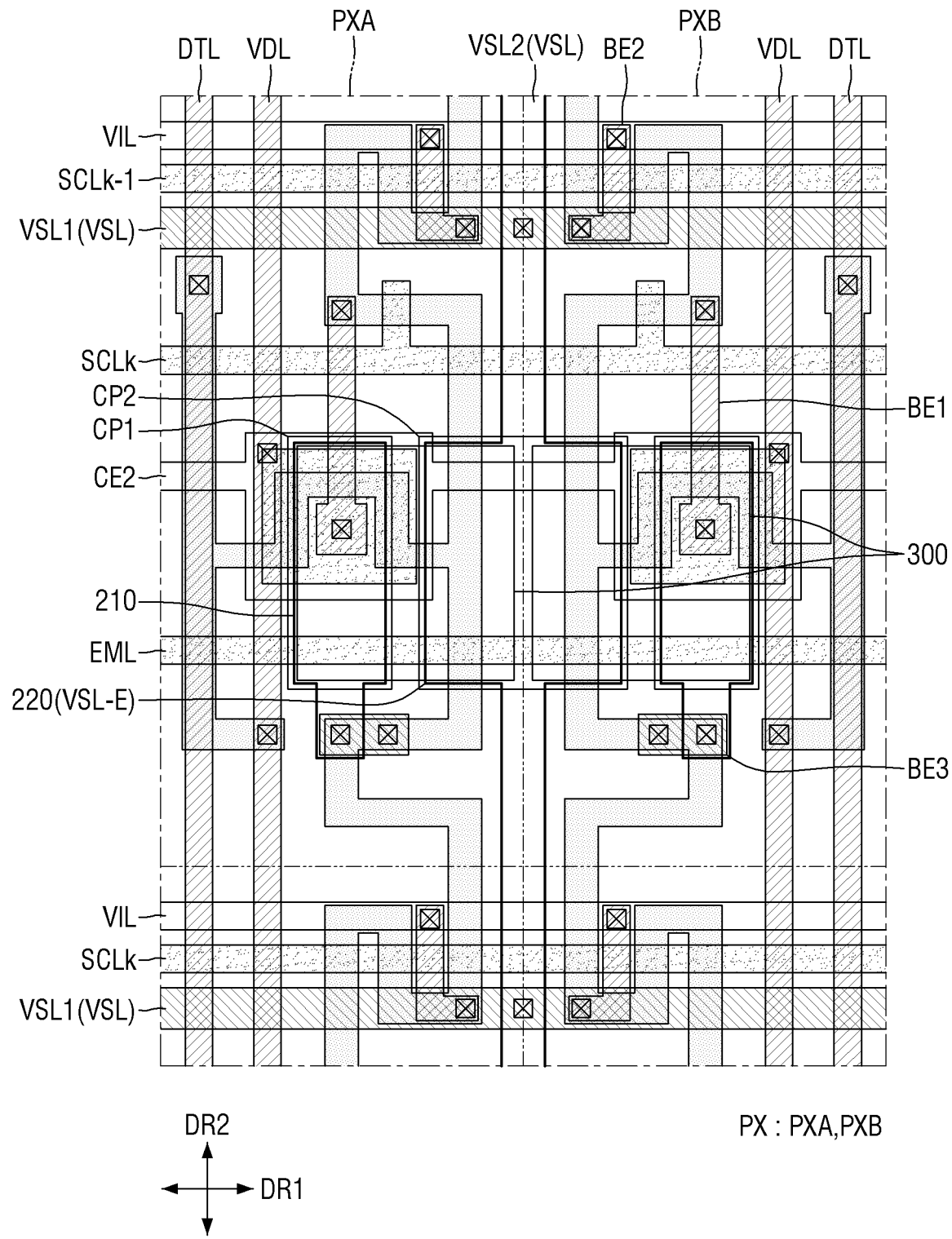
FIG. 4 is a layout view illustrating a portion or a region of the display area of the display device of FIG. 1, including first- and second-type pixels.
Figure 5:
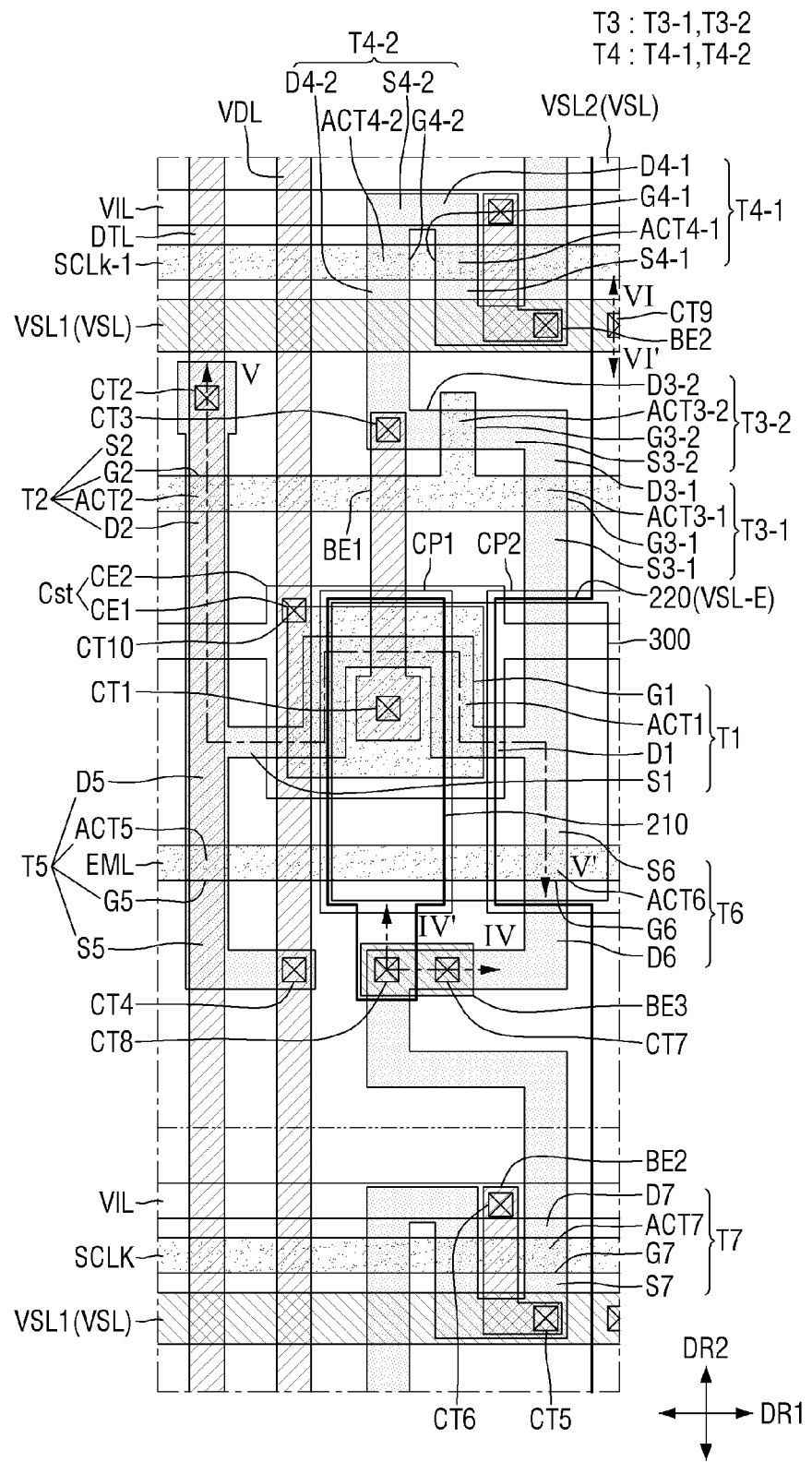
FIG. 5 is a layout view illustrating the first-type pixel of FIG. 4.
Figure 6:
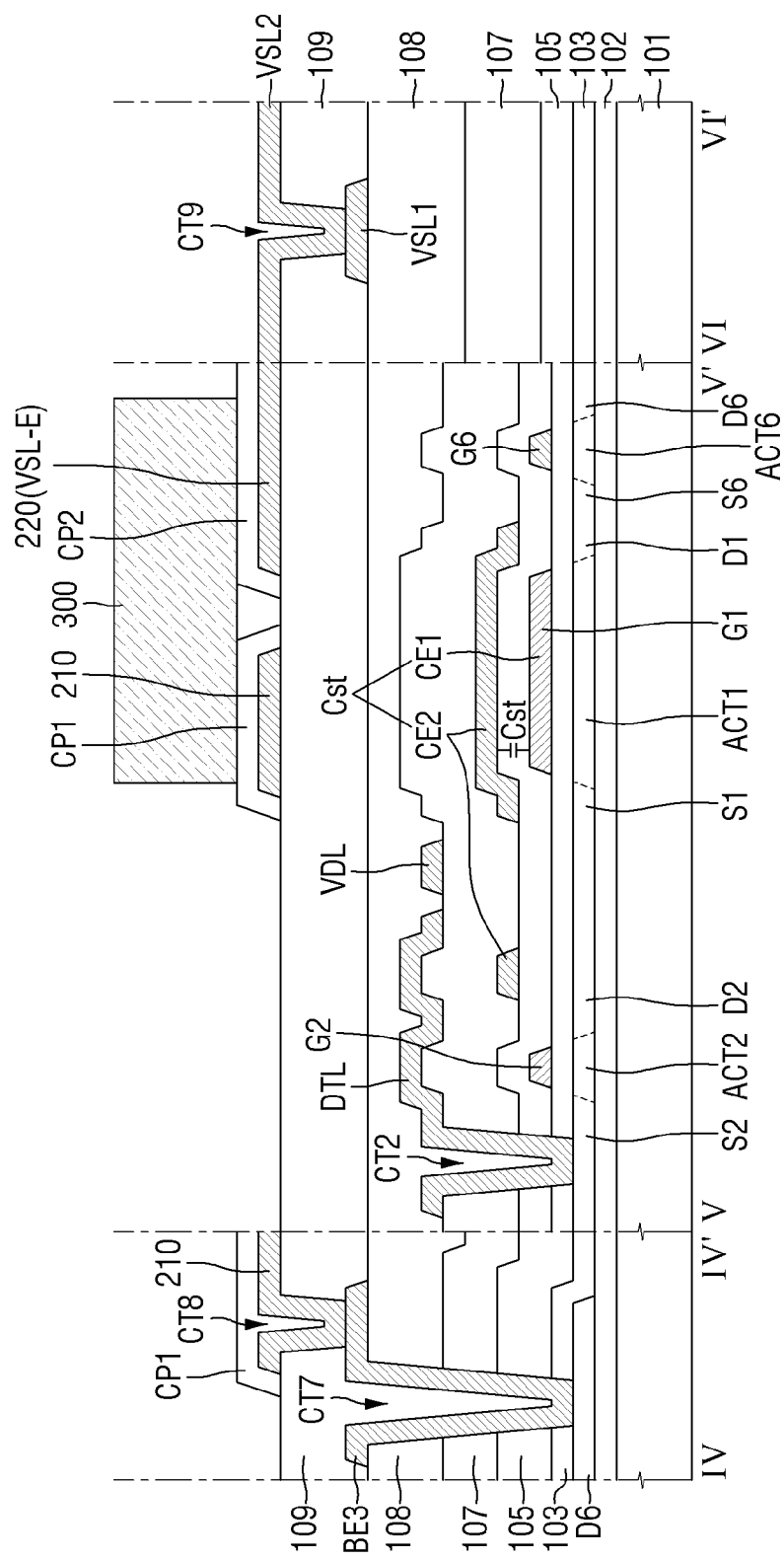
FIG. 6 is a schematic cross-sectional view taken along lines IV-IV', V-V', and VI-VI' of FIG. 5.

FIG. 4 is a layout view illustrating first- and second-type pixels in the display area of the display device of FIG. 1. FIG. 5 is a layout view illustrating the first-type pixel of FIG. 4. FIG. 6 is a schematic cross-sectional view taken along lines IV-IV', V-V', and VI-VI' of FIG. 5. In FIGS. 4 and 5, both sides in the first direction DR1 may be referred to as left and right sides, and both sides in the second direction DR2 may be referred to as upper and lower sides. For convenience, FIGS. 4 and 5 illustrate not only first- and second-type pixels PXA and PXB, but also portions or regions of neighboring pixels on the lower sides (or second sides, in the second direction DR2) of the first- and second-type pixels PXA and PXB. In FIGS. 4 and 5 and in the other drawings, the first- and second-type pixels PXA and PXB may correspond to regions surrounded by dotted lines, and the neighboring pixels may correspond to other regions. It is to be understood that the first- and second-type pixels may be first and second pixels.

Referring to FIGS. 4 through 6, the display device 10 may include pixels PX, and each of the pixels PX may include at least one light-emitting element 300 and pixel circuit elements that may drive the light-emitting element 300. As already mentioned above, each of the pixels PX of the display device 10 may include first through seventh transistors T1 through T7 and a storage capacitor Cst and may be electrically connected to a data line DTL, one or more scan lines SCL, an emission control line EML, a first voltage wire VDL, a second voltage wire VSL, and an initialization voltage wire VIL.

The display device 10 may include pixels PX having different pixel circuit element arrangements. The display device 10 may include first- and second-type pixels PXA and PXB, and the first- and second-type pixels PXA and PXB may have different pixel circuit element arrangements. The first- and second-type pixels PXA and PXB may be disposed adjacent to each other in the first direction DR1, and the pixel circuit elements included in the first-type pixel PXA may be symmetrical with the pixel circuit elements included in the second-type pixel PXB with respect to the boundary between the first- and second-type pixels PXA and PXB.

For example, as will be described later, in each of the pixels PX, a semiconductor layer, including active regions ACT1 through ACT7 of first through seventh transistors T1 through T7, may be disposed. Each of the semiconductor layers of the pixels PX may have a particular or a predetermined pattern, and the semiconductor layers of the first- and second-type pixels PXA and PXB may form a substantially symmetrical pattern together. In each of the pixels PX, a data line DTL and a first voltage wire VDL, which may extend in the second direction DR2, may be disposed. A data line DTL and a first voltage wire VDL may be disposed on the left side of the center of the first-type pixel PXA, and a data line DTL and a first voltage wire VDL may be disposed on the right side of the center of the second-type pixel PXB.

The arrangement of the pixel circuit elements in each of the pixels PX may vary depending on the arrangement of a light-emitting element 300 in the corresponding pixel PX, and the first- and second-type pixels PXA and PXB may have different light-emitting element arrangements. For example, two light-emitting elements 300 may be disposed off-center in the first- and second-type pixels PXA and PXB to be adjacent to the boundary between the first- and second-type pixels PXA and PXB. The locations of the light-emitting elements 300 of the first- and second-type pixels PXA and PXB may be substantially symmetrical with each other.

The light-emitting element 300 of each of the pixels PX may be disposed on first and second electrodes 210 and 220 of an LED "EL" of the corresponding pixel PX, and the arrangement of the light-emitting element 300 may vary depending on the locations of the first and second electrodes 210 and 220. In an embodiment, referring to FIGS. 4 and 5, the second voltage wire VSL may include a first wire VSL1, which may extend in the first direction DR1, and a second wire VSL2, which may extend in the second direction DR2. Referring to FIG. 5, the first and second wires VSL1 and VSL2 may be electrically connected via a contact hole CT9, and the same voltage may be applied to the first and second wires VSL1 and VSL2. For example, in response to the second power supply voltage being applied via the first wire VSL1, the second power supply voltage may also be transmitted to the second wire VSL2.

The second wire VSL2 may be disposed along the boundary between the first- and second-type pixels PXA and PXB. The second wire VSL2 of the second voltage wire VSL may extend in the second direction DR2 along the boundary between the first- and second-type pixels PXA and PXB and may be shared by the first- and second-type pixels PXA and PXB.

In an embodiment, the second wire VSL2 of the second voltage wire VSL may include a wire extension portion VSL-E, which may be wider than the rest of the second wire VSL2, and the light-emitting elements 300 of the first- and second-type pixels PXA and PXB may be disposed at least at a portion or a region on the wire extension portion VSL-E. In an embodiment, the light-emitting elements 300 of the first- and second-type pixels PXA and PXB may be electrically connected to the second voltage wire VSL via the wire extension portion VSL-E, and the second power supply voltage may be transmitted to the light-emitting elements 300 of the first- and second-type pixels PXA and PXB. For example, the wire extension portion VSL-E may correspond to the second electrode 220 of the LED "EL" of each of the first- and second-type pixels PXA and PXB. The wire extension portion VSL-E of the second wire VSL2 may be disposed in and across the first- and second-type pixels PXA and PXB and may be substantially symmetrical with respect to a boundary between the first- and second-type pixels PXA and PXB. The wire extension portion VSL-E, which may correspond to the second electrode 220 of the LED "EL" of each of the first- and second-type pixels PXA and PXB, may be disposed across the boundary between the first- and second-type pixels PXA and PXB, and the light-emitting elements 300 of the first- and second-type pixels PXA and PXB may be arranged or disposed symmetrically with respect to the boundary between the first- and second-type pixels PXA and PXB. The display device 10 may include different types of pixels, for example, the first- and second-type pixels PXA and PXB, and the first- and second-type pixels PXA and PXB may share the same second wire VSL2 of the same second voltage wire VSL and may have a substantially symmetrical pixel circuit element arrangement with respect to each other. The arrangements and the structures of the first- and second-type pixels PXA and PXB will be described later in further detail.

The cross-sectional structure and the layout of each of the pixels PX, for example, the first-type pixel PXA, will hereinafter be described. The display device 10 may include a first substrate 101, and pixel circuit elements may be disposed on the first substrate 101. The first substrate 101 may be formed of an insulating material such as glass, quartz, or a polymer resin. The first substrate 101 may be a rigid substrate or may be a flexible substrate that may be bendable, foldable, or rollable.

A buffer layer 102 may be disposed on the first substrate 101. The buffer layer 102 may be disposed on the entire surface of the first substrate 101. The buffer layer 102 may be formed or disposed on the first substrate 101 to protect transistors of the pixels PX from moisture that may infiltrate through the first substrate 101, which may be vulnerable to moisture, and may perform a surface planarization function. The buffer layer 102 may include inorganic layers that may be alternately stacked. For example, the buffer layer 102 may be formed as a multilayer film in which at least one of a silicon oxide (SiOx) layer, a silicon nitride (SiNx) layer, and a silicon oxynitride (SiON) layer may be alternately stacked.

Although not illustrated, a light-blocking layer may be disposed between the buffer layer 102 and the first substrate 101. The light-blocking layer may be disposed to overlap portions of the active layers of the first through seventh transistors T1 through T7. The light-blocking layer may include a material that may block the transmission of light and may thus prevent light from being incident upon the active layers of the first through seventh transistors T1 through T7. For example, the light-blocking layer may be formed of an opaque metallic material that may block the transmission of light. The light-blocking layer may not necessarily overlap all the active layers of the first through seventh transistors T1 through T7.

A semiconductor layers may be disposed on the buffer layer 102. The semiconductor layer may include the active layers of the first through seventh transistors T1 through T7. The active layers of the first through seventh transistors T1 through T7 may generally include active regions ACT, source regions, and drain regions.

The first transistor T1 may include a first active region ACT1, a first gate electrode G1, a first source region S1, and a first drain region D1 and may be disposed at the center of the pixels PX. The first active region ACT1 of the first transistor T1 may be disposed to overlap the first gate electrode G1, which may be disposed in a first gate conductive layer. The semiconductor layer may include portions that may extend in the first direction DR1 and portions that may be bent in the second direction DR2 and may overlap the first gate electrode G1. A portion or a region of the semiconductor layer that may overlap the first gate electrode G1 may form the first active region ACT1 of the first transistor T1, and the first transistor T1 may have a wide channel region.

The first source region S1 of the first transistor T1 may be electrically connected to a second drain region D2 of the second transistor T2 and a fifth drain region D5 of the fifth transistor T5. The first drain region D1 of the first transistor T1 may be electrically connected to a third drain region D3 of the third transistor T3 and a sixth source region S6 of the sixth transistor T6.

The second transistor T2 may include a second active region ACT2, a second gate electrode G2, a second source region S2, and a second drain region D2. Based on the first type pixel PXA, the second transistor T2 may be disposed on the left side of the center of the pixel PX. The second active region ACT2 of the second transistor T2 may be disposed to overlap one of k-th scan line SCLk disposed in a first conductive layer. For example, the second active region ACT2 of the second transistor T2 may be disposed to overlap an upper scan line SCLk, and a portion or region of the upper scan line SCLk that may overlap the second active region ACT2 may form the second gate electrode G2. The second gate electrode G2 of the second transistor T2 may be a portion or region of the k-th scan line SCLk.

As will be described later, the second source region S2 of the second transistor T2 may be electrically connected to a data line DTL. The second drain region D2 of the second transistor T2 may be electrically connected to the first source region S1 of the first transistor T1 and the fifth drain region D5 of the fifth transistor T5.

The third transistor T3 may include a third active region ACT3, a third gate electrode G3, a third source region S3, and the third drain region D3 and may be disposed on an upper side of the first transistor T1. The third transistor T3 may be a dual transistor including (3-1)- and (3-2)-th transistors T3-1 and T3-2.

The (3-1)-th transistor T3-1 may include a (3-1)-th active region ACT3-1, a (3-1)-th gate electrode G3-1, a (3-1)-th source region S3-1, and a (3-1)-th drain region D3-1, and the (3-2)-th transistor T3-2 may include a (3-2)-th active region ACT3-2, a (3-2)-th gate electrode G3-2, a (3-2)-th source region S3-2, and a (3-2)-th drain region D3-2.

The (3-1)- and (3-2)-th active regions ACT3-1 and ACT3-2 may be disposed to overlap one of the scan lines SCLk. For example, the (3-1)- and (3-2)-th active regions ACT3-1 and ACT3-2 may be disposed to overlap the upper scan line SCLk, and portions or regions of the upper k-th scan line SCLk that may overlap the (3-1)- and (3-2)-th active regions ACT3-1 and ACT3-2 may form the (3-1)- and (3-2)-th gate electrodes G3-1 and G3-2. The (3-1)- and (3-2)-th gate electrodes G3-1 and G3-2 may be portions of the k-th scan line SCLk.

The (3-1)-th source region S3-1 of the (3-1)-th transistor T3-1 may be electrically connected to the first drain region D1 of the first transistor T1 and the sixth source region S6 of the sixth transistor T6, and the (3-1)-th drain region D3-1 of the (3-1)-th transistor T3-1 may be electrically connected to the (3-2)-th source region S3-2 of the (3-2)-th transistor T3-2. The (3-2)-th source region S3-2 of the (3-2)-th transistor T3-2 may be electrically connected to the (3-1)-th drain region D3-1 of the (3-1)-th transistor T3-1, and the (3-2)-th drain region D3-2 of the (3-2)-th transistor T3-2 may be electrically connected to a (4-2)-th drain region D4-2 of a (4-2)-th transistor T4-2.

The fourth transistor T4 may include a fourth active region ACT4, a fourth gate electrode G4, a fourth source region S4, and a fourth drain region D4 and may be disposed on the upper side of the third transistor T3. The fourth transistor T4 may be a dual transistor including a (4-1)-th transistor and the (4-2)-th transistor T4-2.

The (4-1)-th transistor T4-1 may include a (4-1)-th active region ACT4-1, a (4-1)-th gate electrode G4-1, a (4-1)-th source region S4-1, and a (4-1)-th drain region D4-1, and the (4-2)-th transistor T4-2 may include a (4-2)-th active region ACT4-2, a (4-2)-th gate electrode G4-2, a (4-2)-th source region S4-2, and the (4-2)-th drain region D4-2. The semiconductor layer may include portions that extend in the second direction DR2 and portions that may be bent in the first and second directions DR1 and DR2 and may form the (4-1)- and (4-2)-th active regions ACT4-1 and ACT4-2.

The (4-1)- and (4-2)-th active regions ACT4-1 and ACT4-2 may be disposed to overlap a (k−1)-th scan line SCLk−1. Portions of the (k−1)-th scan line SCLk−1 that overlap the (4-1)- and (4-2)-th active regions ACT4-1 and ACT4-2 may form the (4-1)- and (4-2)-th gate electrodes G4-1 and G4-2. The (4-1)- and (4-2)-th gate electrodes G4-1 and G4-2 may be portions of the (k−1)-th scan line SCLk−1.

As will be described later, the (4-1)-th source region S4-1 of the (4-1)-th transistor T4-1 may be electrically connected to an initialization voltage wire VIL. The (4-1)-th drain region D4-1 of the (4-1)-th transistor T4-1 may be electrically connected to the (4-2)-th source region S4-2 of the (4-2)-th transistor T4-2. The (4-2)-th drain region D4-2 of the (4-2)-th transistor T4-2 may be electrically connected to the (3-2)-th drain region D3-2 of the (3-2)-th transistor T3-2.

The fifth transistor T5 may include a fifth active region ACT5, a fifth gate electrode G5, a fifth source region S5, and the fifth drain region D5. Based on the first type pixel PXA, the fifth transistor T5 may be disposed on the lower left side of the center of the pixel PX. The fifth active region ACT5 of the fifth transistor T5 may be disposed to overlap a k-th emission control line EML, which may be disposed in the first gate conductive layer, and a portion or region of the k-th emission control line EML that may overlap the fifth active region ACT5 may form the fifth gate electrode G5. The fifth gate electrode G5 of the fifth transistor T5 may be a portion or region of the k-th emission control line EML.

As will be described later, the fifth source region S5 of the fifth transistor T5 may be electrically connected to a first voltage wire VDL. The fifth drain region D5 of the fifth transistor T5 may be electrically connected to the first source region S1 of the first transistor T1 and the second drain region D2 of the second transistor T2.

The sixth transistor T6 may include a sixth active region ACT6, a sixth gate electrode G6, the sixth source region S6, and a sixth drain region D6. And, based on the first type pixel PXA, the sixth transistor T6 may be disposed on the lower right side of the center of the pixel PX. The sixth active region ACT6 of the sixth transistor T6 may be disposed to overlap the k-th emission control line EML, which is disposed in the first gate conductive layer, and a portion or region of the k-th emission control line EML that may overlap the sixth active region ACT6 may form the sixth gate electrode G6. The sixth gate electrode G6 of the sixth transistor T6 may be a portion or region of the k-th emission control line EML.

The sixth source region S6 of the sixth transistor T6 may be electrically connected to the first drain region D1 of the first transistor T1 and the (3-1)-th source region S3-1 of the (3-1)-th transistor T3-1. The sixth drain region D6 may be electrically connected to a third connecting electrode BE3 and may thus be electrically connected to the first electrode 210 of the LED "EL".

The seventh transistor T7 may include a seventh active region ACT7, a seventh gate electrode G7, a seventh source region S7, and a seventh drain region D7.

The seventh active region ACT7 of the seventh transistor T7 may be disposed to overlap one of the k-th scan lines SCL. For example, the seventh active region ACT7 may be disposed to overlap a lower scan line SCLk, and a portion or region of the lower scan line SCLk that may overlap the seventh active region ACT7 may form the seventh gate electrode G7. In an embodiment, the seventh active region ACT7 may be disposed to overlap the k-th scan line SCLk or the (k−1)-th scan line SCLk−1. The seventh gate electrode G7 of the seventh transistor T7 may be a portion or region of the k-th scan line SCLk or the (k−1)-th scan line SCLk−1.

The seventh source region S7 of the seventh transistor T7 may be electrically connected to a second connecting electrode BE2 via a fifth contact hole CT5. The seventh drain region D7 of the seventh transistor T7 may be electrically connected to the third connecting electrode BE3 via a seventh contact hole CT7.

In an embodiment, the semiconductor layer may include polycrystalline silicon, monocrystalline silicon, or an oxide semiconductor. In a case where the semiconductor layer may include polycrystalline silicon, the active regions of the first through seventh transistors T1 through T7 may be channel regions, and the source regions S and the drain regions D of the first through seventh transistors T1 through T7 may be doped regions. The doped regions may be regions doped with impurities, and the channel regions may be disposed between the doped regions. Polycrystalline silicon may be formed by crystallizing amorphous silicon through, for example, rapid thermal annealing (RTA), solid phase crystallization (SPC), excimer laser annealing (ELA), metal-induced crystallization (MILC), or sequential lateral solidification (SLS). In an embodiment, the semiconductor layer may include monocrystalline silicon, LTPS, or amorphous silicon.

However, the disclosure is not limited to these examples. In an embodiment, the semiconductor layer may include an oxide semiconductor. In this case, the doped regions may be conductor regions. In a case where the semiconductor layer may include an oxide semiconductor, the oxide semiconductor may be an oxide semiconductor containing indium (In). In an embodiment, the oxide semiconductor may be indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO), but the disclosure is not limited thereto.

A first gate insulating layer 103 may be disposed on the semiconductor layer and the buffer layer 102. The first gate insulating layer 103 may function as the gate insulating film of each of the first through seventh transistors T1 through T7. The first gate insulating layer 103 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

The first gate conductive layer may be disposed on the first gate insulating layer 103. The first gate conductive layer may include the (k−1)-th scan line SCLk−1, the k-th scan line SCLk, the k-th emission control line EML, the first gate electrode G1, and a first capacitor electrode CE1 of the storage capacitor Cst.

Scan lines SCLk−1 or SCLk may extend in the first direction DR1. The scan lines SCLk−1 or SCLk may be disposed across the boundaries between pairs of adjacent pixels PX in the first direction DR1. Based on the first type pixel PXA, the scan lines SCLk−1 or SCLk may be disposed on upper or lower sides of the center of the pixel PX. Portions or regions of the upper scan line SCLk may be the second and third gate electrodes G2 and G3, and portions or regions of the lower scan line SCLk may be the fifth and sixth gate electrodes G5 and G6. Since there may exist other pixels PX adjacent to the first-type pixel PXA in the second direction DR2, the (k−1)-th scan line SCLk−1 and the k-th scan lines SCLk are both illustrated in FIGS. 4 through 6.

The k-th emission control line EML may extend in the first direction DR1. The k-th emission control line EML may be disposed across the boundary between the first- and second-type pixels PXA and PXB, which may be adjacent in the first direction DR1. The k-th emission control line EML may be disposed between the k-th scan lines SCLk, and portions or regions of the k-th emission control line EML may be the second and third gate electrodes G2 and G3.

As previously described above, the first gate electrode G1 may be disposed to overlap the first active region ACT1.

The storage capacitor Cst may include the first capacitor electrode CE1 and a second capacitor electrode CE2. The first capacitor electrode CE1, which may account for at least a portion or region of the first gate conductive layer, may correspond to a portion or region of the first conductive layer that may be used as the first gate electrode G1 and may overlap the second capacitor electrode CE2, which may be disposed in a second gate conductive layer. The first capacitor electrode CE1 may be electrically connected to the first connecting electrode BE1 via a first contact hole CT1. As will be described later, the first capacitor electrode CE1 may be electrically connected to the (4-2)-th transistor T4-2 via the first connecting electrode BE1, but the disclosure is not limited thereto. Alternatively, in an embodiment, the first capacitor electrode CE1 may be electrically connected to the third and fourth transistors T3 and T4.

The first gate conductive layer may be formed as a single- or multilayer film including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A first interlayer insulating layer 105 may be disposed on the first gate conductive layer. The first interlayer insulating layer 105 may function as an insulating film between the first gate conductive layer and layers disposed on the first gate conductive layer. The first interlayer insulating layer 105 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

The second gate conductive layer may be disposed on the first interlayer insulating layer 105. The second gate conductive layer may include the initialization voltage wire VIL and the second capacitor electrode CE2 of the storage capacitor Cst.

The initialization voltage wire VIL may extend in the first direction DR1. The initialization voltage wire VIL may be disposed across the boundary between the first- and second-type pixels PXA and PXB, which may be adjacent in the first direction DR1. The initialization voltage wire VIL may be disposed on an upper side of the lower k-th scan line SCLk. The initialization voltage wire VIL may be electrically connected to the second connecting electrode BE2 via a sixth contact hole CT6 and may thus be electrically connected to the (4-1)-th transistor T4-1 and the seventh transistor T7.

The second capacitor electrode CE2 of the storage capacitor Cst may be disposed to overlap the first capacitor electrode CE1 of the storage capacitor Cst. The second capacitor electrode CE2 may include a portion or region that may extend in the first direction DR1 and an extension that may be wider than the rest of the second capacitor electrode CE2. The extension of the second capacitor electrode CE2 may be disposed to overlap the first capacitor electrode CE1, and a storage capacitor Cst of FIG. 6 may be formed or disposed between the extension of the second capacitor electrode CE2 and the first capacitor electrode CE1. The second capacitor electrode CE2 may be electrically connected to the first voltage wire VDL via a tenth contact hole CT10.

The second gate conductive layer may be formed as a single- or multilayer film including Mo, Al, Cr, Au, Ti, Ni, Nd, Cu, or an alloy thereof, but the disclosure is not limited thereto.

A second interlayer insulating layer 107 may be disposed on the second gate conductive layer. The second interlayer insulating layer 107 may function as an insulating film between the first gate conductive layer and layers disposed on the first gate conductive layer. The second interlayer insulating layer 107 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

A first data conductive layer may be disposed on the second interlayer insulating layer 107. The first data conductive layer may include the data line DTL, the first voltage wire VDL, the first connecting electrode BE1, and the second connecting electrode BE2.

The data line DTL may extend in the second direction DR2 and may be disposed across the boundaries between the first-type pixel PXA and pixels PX adjacent to the first-type pixel PXA in the second direction DR2. The data line DTL may be disposed on a side, in the first direction DR1, of the center of the first-type pixel PXA. As previously described above, the display device 10 may include different types of pixels having different pixel circuit element arrangements, for example, the first- and second-type pixels PXA and PXB, and the location of the data line DTL may differ from the first-type pixel PXA to the second-type pixel PXB. For example, the data line DTL may be disposed in the first-type pixel PXA, on the left side of the center of the first-type pixel PXA, or may be disposed in the second-type pixel PXB, on the right side of the center of the second-type pixel PXB. As will be described later, the data line DTL may be spaced apart from the first wire VSL1 of the second voltage wire VSL with the first voltage wire VDL interposed therebetween. The data line DTL may be electrically connected to the second source region S2 of the second transistor T2 via a second contact hole CT2 that may penetrate the first gate insulating layer 103, the first interlayer insulating layer 105, and the second interlayer insulating layer 107, and a data signal, applied to the data line DTL, may be transmitted to the second transistor T2.

The first voltage wire VDL may extend in the second direction DR2 and may be disposed across the boundaries between the first-type pixel PXA and the pixels PX adjacent to the first-type pixel PXA in the second direction DR2. The first voltage wire VDL may be disposed on a side, in the first direction DR1, of the data line DTL. As previously described above, the display device 10 may include different types of pixels having different pixel circuit element arrangements, for example, the first- and second-type pixels PXA and PXB, and the location of the first voltage wire VDL may differ from the first-type pixel PXA to the second-type pixel PXB. For example, the first voltage wire VDL may be disposed in the first-type pixel PXA, on the right side of the data line DTL, or may be disposed in the second-type pixel PXB, on the left side of the data line DTL.

The first voltage wire VDL may be electrically connected to the fifth source region S5 of the fifth transistor T5 via a fourth contact hole CT4 that may penetrate the first gate insulating layer 103, the first interlayer insulating layer 105, and the second interlayer insulating layer 107, and the first power supply voltage, applied to the first voltage wire VDL, may be transmitted to the fifth transistor T5. The first voltage wire VDL may be electrically connected to the second capacitor electrode CE2 of the storage capacitor Cst via the tenth contact hole CT10 that may penetrate the second interlayer insulating layer 107.

The first connecting electrode BE1 may be disposed to overlap the first gate electrode G1 of the first transistor T1 and the (3-2)-th drain region D3-2 of the (3-2)-th transistor T3-2. The first connecting electrode BE1 may be electrically connected to the first gate electrode G1 via the first contact hole CT1 that may penetrate the first gate insulating layer 103, the first interlayer insulating layer 105, and the second interlayer insulating layer 107 and may be electrically connected to the (3-2)-th drain region D3-2 via a third contact hole CT3.

The second connecting electrode BE2 may be disposed to overlap the seventh source region S7 of the seventh transistor T7 and the initialization voltage wire VIL. The second connecting electrode BE2 may be electrically connected to the seventh source region S7 via the fifth contact hole CT5 that may penetrate the first gate insulating layer 103, the first interlayer insulating layer 105, and the second interlayer insulating layer 107 and may be electrically connected to the initialization voltage wire VIL via the sixth contact hole CT6 that may penetrate the second interlayer insulating layer 107. The sixth transistor T6 may be electrically connected to the initialization voltage wire VIL via the third connecting electrode BE3 so that the initialization voltage may be transmitted to the sixth transistor T6.

The first data conductive layer may be formed as a single- or multilayer film including Mo, Al, Cr, Au, Ti, Ni, Nd, Cu, or an alloy thereof, but the disclosure is not limited thereto.

A third interlayer insulating layer 108 may be disposed on the first data conductive layer. The third interlayer insulating layer 108 may function as an insulating film between the first data conductive layer and layers disposed on the first data conductive layer. The third interlayer insulating layer 108 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON), but the disclosure is not limited thereto. Alternatively, in an embodiment, the third interlayer insulating layer 108 may include an organic insulating material such as, for example, polyimide (PI).

A second data conductive layer may be disposed on the third interlayer insulating layer 108. The second data conductive layer may include the first wire VSL1 of the second voltage wire VSL and the third connecting electrode BE3.

The first wire VSL1 of the second voltage wire VSL may extend in the first direction DR1. The first wire VSL1 may be disposed across the boundary between the first- and second-type pixels PXA and PXB, which may be adjacent in the first direction DR1, and a k-th row of pixels PX, including the first- and second-type pixels PXA and PXB, may share the first wire VSL1. The first wire VSL1 may be disposed between the (k−1)-th scan line SCLk−1 and the k-th scan line SCLk. The first wire VSL1 may be electrically connected to the second wire VSL2, which may be disposed in an electrode conductive layer that will be described later, and the second power supply voltage, applied to the second wire VSL2, may be transmitted to the second electrode 220 of the LED "EL" of the first-type pixel PXA.

However, the disclosure is not limited thereto. Alternatively, in an embodiment, the first wire VSL1 may include an extension having a relatively large width and may be disposed in, for example, the electrode conductive layer. These embodiments will be described later in detail.

The third connecting electrode BE3 may be disposed to overlap the sixth drain region D6 of the sixth transistor T6. The third connecting electrode BE3 may be electrically connected to the sixth drain region D6 via a seventh contact hole CT7 that may penetrate the first gate insulating layer 103 and the first, second, and third interlayer insulating layers 105, 107, and 108. The third connecting electrode BE3 may be electrically connected to the first electrode 210.

A first planarization layer 109 may be disposed on the second data conductive layer. The first planarization layer 109 may include an organic insulating material such as, for example, polyimide (PI), and may thus perform a surface planarization function, but the disclosure is not limited thereto. Conductive layers may be disposed between the first planarization layer 109 and the second data conductive layer.

The electrode conductive layer and the light-emitting element 300 may be disposed on the first planarization layer 109. The electrode conductive layer may include the first and second electrodes 210 and 220 of the LED "EL" of the first-type pixel PXA and the second wire VSL2 of the second voltage wire VSL.

The second wire VSL2 of the second voltage wire VSL may extend in the second direction DR2. As previously described above, the second wire VSL2 may be disposed along the boundary between the first- and second-type pixels PXA and PXB and may be shared by the first- and second-type pixels PXA and PXB. The second wire VSL2 may intersect the first wire VSL1 and may be electrically connected to the first wire VSL1 via the ninth contact hole CT9, which may be formed or disposed in the overlapping area of the first and second wires VSL1 and VSL2. The second power supply voltage, applied to the first wire VSL1, may be transmitted to the second wire VSL2.

The first electrode 210 may be disposed in the middle of the first-type pixel PXA. In a plan view, the first electrode 210 may have a shape that may have a predetermined width and may extend in the second direction DR2. The first electrode 210 may include a portion or region that may be disposed to overlap the third connecting electrode BE3 and may be electrically connected to the third connecting electrode BE3 via an eighth contact hole CT8 that may penetrate the first planarization layer 109. The first electrode 210 may be electrically connected to the sixth transistor T6 via the third connecting electrode BE3.

The second electrode 220 may be spaced apart from, and may face, the first electrode 210 in the first direction DR1. In a plan view, the second electrode 220, like the first electrode 210, may have a shape that may have a predetermined width and may extend in the second direction DR2. The second electrode 220 may be electrically connected to the second wire VSL2 of the second voltage wire VSL. In an embodiment, the second wire VSL2 may include the wire extension portion VSL-E, which may have a larger width than the rest of the second wire VSL2, and the second electrode 220 may substantially account for the wire extension portion VSL-E. The wire extension portion VSL-E may have a shape that at least partially protrudes toward the first electrode 210. The wire extension portion VSL-E may have a larger width than the first and second wires VSL1 and VSL2. The wire extension portion VSL-E or the second electrode 220 may be directly electrically connected to, or integrally formed with, the second wire VSL2, and the second power supply voltage, applied from the first wire VSL1, may be applied to the second electrode 220.

In an embodiment, the first and second electrodes 210 and 220 may include a conductive material with high thermal conductivity. For example, the first and second electrodes 210 and 220 may include a metal such as Cu, Al, or tungsten (W). As will be described later, the first and second electrodes 210 and 220 may overlap the light-emitting element 300 over a relatively large area and may include a material with a high thermal conductivity, thereby effectively releasing heat emitted from the light-emitting element 300.

However, the disclosure is not limited thereto. The first and second electrodes 210 and 220 may have a structure in which one or more layers of a transparent conductive material and a metal with high thermal conductivity may be stacked or may be formed as single-layer films including a transparent conductive material and a metal with high thermal conductivity. In an embodiment, the first and second electrodes 210 and 220 may be stacks of ITO/silver (Ag)/ITO or may include an alloy of Ag, Cu, Al, Ni, or lanthanum (La).

The light-emitting element 300 may be disposed on the first and second electrodes 210 and 220 and may be electrically connected to the first and second electrodes 210 and 220. First and second ends of the light-emitting element 300 may be electrically connected to the first and second electrodes 210 and 220 via pad electrodes (CP1 and CP2) that will be described later, and may emit light of a particular wavelength range in response to electrical signals applied thereto from the first and second electrodes 210 and 220. In an embodiment, the light-emitting element 300 may be bonded to, or physically connected to, the first and second electrodes 210 and 220. For example, the light-emitting element 300 may be bonded, via the pad electrodes (CP1 and CP2) and an anisotropic conductive film (ACF), to, or as a eutectic alloy bonded to, the first and second electrodes 210 and 220, but the disclosure is not limited thereto.

In an embodiment, the light-emitting element 300 may be an LED or an LED chip including an inorganic semiconductor. In an embodiment, the light-emitting element 300 may have a shape that may extend in one direction and may be a micro-LED chip having a size of several micro- or nano-meters. In a case where the light-emitting element 300 is an LED chip, the light-emitting element 300 may include a semiconductor layer doped with impurities of an arbitrary conductivity type (for example, a p type or an n type) and may emit light of a particular wavelength range in response to an electrical signal being transmitted thereto from an external power source.

The light-emitting element 300 may have a shape that may extend in one direction. The light-emitting element 300 may have a long axis that may extend in the direction in which the light-emitting element 300 may extend and a short axis that may be perpendicular to the long axis. For example, the light-emitting element 300 may have an aspect ratio in a range of about 1.2:1 to about 100:1. The length of the long axis of the light-emitting element 300 may range from several micrometers to hundreds of micrometers. For example, the long axis of the light-emitting element 300 may have a length in a range of about 1 µm to about 800 µm, a range of about 1 µm to about 500 µm, or a range of about 10 µm to about 300 µm, but the disclosure is not limited thereto.

The light-emitting element 300 may have a structure in which inorganic semiconductor layers may be stacked. In an embodiment, the direction in which the inorganic semiconductor layers may be stacked may not necessarily be parallel to the direction in which the long axis of the light-emitting element 300 may extend. For example, in a case where the light-emitting element 300 has a shape that may extend in one direction, the inorganic semiconductor layers may be stacked in a direction substantially perpendicular to the direction in which the light-emitting element 300 may extend. The inorganic semiconductor layers may extend in the direction in which the long axis of the light-emitting element 300 may extend, and may be stacked in a thickness direction substantially perpendicular to the direction in which the long axis of the light-emitting element 300 may extend.

Figure 7:
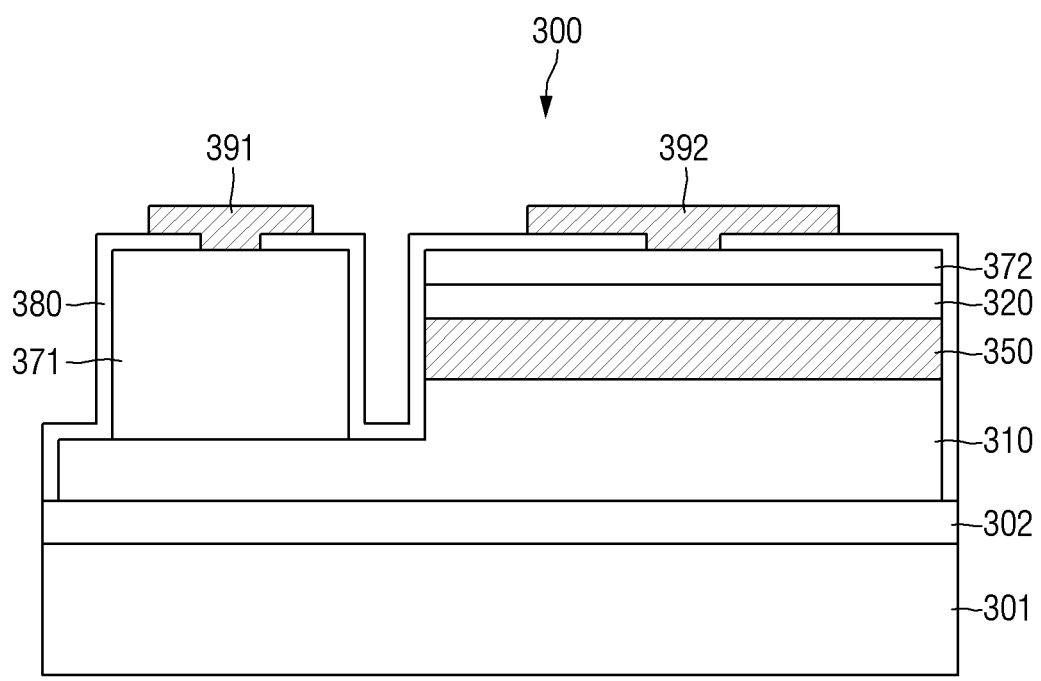
FIG. 7 is a schematic cross-sectional view illustrating a light-emitting element according to an embodiment.

FIG. 7 is a schematic cross-sectional view illustrating a light-emitting element according to an embodiment.

Referring to FIG. 7, the light-emitting element 300 may include a first semiconductor layer 310, a second semiconductor layer 320, and a light-emitting layer 350, which may be disposed between the first and second semiconductor layers 310 and 320. The light-emitting element 300 may include a lower substrate 301, a buffer semiconductor layer 302, an auxiliary layer 371, an electrode layer 372, an insulating film 380, and electrode portions (391 and 392).

The lower substrate 301 may be a growth substrate that may grow the first semiconductor layer 310. For example, the lower substrate 301 may include a transparent substrate such as a sapphire ($Al_2O_3$) substrate or a glass substrate, but the disclosure is not limited thereto. Alternatively, in an embodiment, the lower substrate 301 may include a conductive substrate formed of, for example, GaN, SiC, ZnO, Si, GaP, or GaAs.

The buffer semiconductor layer 302 may be disposed on the lower substrate 301. The buffer semiconductor layer 302 may be provided or disposed to reduce the difference in lattice constant between the lower substrate 301 and the first semiconductor layer 310. In an embodiment, the buffer semiconductor layer 302 may include an undoped semiconductor. The buffer semiconductor layer 302 may include substantially the same or similar material as the first semiconductor layer 310, but may include a material not doped with an n- or p-type dopant. For example, the buffer semiconductor layer 302 may include at least one of undoped InAlGaN, GaN, AlGaN, InGaN, AlN, and InN. The buffer semiconductor layer 302 is illustrated as being formed as a single-layer film, but the disclosure is not limited thereto. Alternatively, layers may be repeatedly disposed in the buffer semiconductor layer 302.

The first semiconductor layer 310 may be disposed on the buffer semiconductor layer 302. The first semiconductor layer 310 may include an n-type semiconductor. For example, in a case where the light-emitting element 300 emits light of a blue wavelength range, the first semiconductor layer 310 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be one of AlGaInN, GaN, AlGaN, InGaN, AlN, and/or InN that may be doped with an n-type dopant. The first semiconductor layer 310 may be doped with an n-type dopant, and the n-type dopant may be, for example, Si, Ge, or Sn. In an embodiment, the first semiconductor layer 310 may be n-GaN doped with n-type Si.

The second semiconductor layer 320 may be disposed on the light-emitting layer 350. The second semiconductor layer 320 may include a p-type semiconductor. For example, in a case where the light-emitting element 300 emits light of a blue or green wavelength range, the second semiconductor layer 320 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be one of AlGaInN, GaN, AlGaN, InGaN, AlN, and/or InN that may be doped with a p-type dopant. The second semiconductor layer 320 may be doped with a p-type dopant, and the p-type dopant may be, for example, Mg, Zn, Ca, Se, or Ba. In an embodiment, the second semiconductor layer 320 may be p-GaN doped with p-type Mg.

The first and second semiconductor layers 310 and 320 may be illustrated as being formed as single-layer films, but the disclosure is not limited thereto. In an embodiment, the light-emitting element 300 may include more than one first semiconductor layer 310 and more than one second semiconductor layer 320 depending on the material of the light-emitting layer 350 and may include other semiconductor layers, for example, clad layers or tensile strain barrier reducing (TSBR) layers.

The light-emitting layer 350 may be disposed between the first and second semiconductor layers 310 and 320. The light-emitting layer 350 may be disposed on a portion or region of the first semiconductor layer 310, and the auxiliary layer 371 may be disposed on a portion or region of the first semiconductor layer 310 where the light-emitting layer 350 may not be disposed. The light-emitting layer 350 may include a single- or multi-quantum well structure material. In a case where the light-emitting layer 350 may include a material having a multi-quantum well structure, the light-emitting layer 350 may have a structure in which multiple quantum layers and multiple well layers may be alternately stacked. The light-emitting layer 350 may emit light by combining electron-hole pairs in accordance with electrical signals applied thereto via the first and second semiconductor layers 310 and 320. For example, in a case where the light-emitting layer 350 emits light of a blue wavelength range, the quantum layers may include a material such as AlGaN or AlGaInN. In a case where the light-emitting layer 350 has a multi-quantum well structure in which multiple quantum layers and multiple well layers may be alternately stacked, the quantum layers may include a material such as AlGaN or AlGaInN, and the well layers may include a material such as GaN or AlInN. In an embodiment where the light-emitting layer 350 may include AlGaInN as its quantum layer(s) and AlInN as its well layer(s), the light-emitting layer 350 may emit blue light having a central wavelength in a range of about 450 nm to about 495 nm.

However, the disclosure is not limited thereto. In an embodiment, the light-emitting layer 350 may have a structure in which a semiconductor material having a large band gap energy and a semiconductor material having a small band gap energy may be alternately stacked or may include group III or group V semiconductor materials depending on the wavelength of light to be emitted. The type of light emitted by the light-emitting layer 350 is not particularly limited. The light-emitting layer 350 may emit light of a red or green wavelength range, instead of blue light.

The auxiliary layer 371 and the electrode layer 372 may be disposed on the first and second semiconductor layers 310 and 320, respectively. The first semiconductor layer 310 may have a stepped structure at the top thereof so that at least a portion or region of the first semiconductor layer 310 may be thinner than the rest of the first semiconductor layer 310. The light-emitting layer 350 may be disposed on a portion or region of the first semiconductor layer 310 that may be relatively thick, and the auxiliary layer 371 may be disposed on a portion or region of the first semiconductor layer 310 that may be relatively thin. The auxiliary layer 371 may compensate for a height difference generated by the light-emitting layer 350, the second semiconductor layer 320, and the electrode layer 372. The auxiliary layer 371 may include a conductive material or a semiconductor material and may thus be able to transmit electrical signals, applied to electrode portions (391 and 392), to the first semiconductor layer 310. The electrode layer 372 may be disposed on the second semiconductor layer 320. The electrode layer 372 may be an ohmic contact electrode, but the disclosure is not limited thereto. Alternatively, the electrode layer 372 may be a Schottky contact electrode. The electrode layer 372 may reduce the resistance between the electrode portions (391 and 392) of the light-emitting element 300 and the second semiconductor layer 320. The electrode layer 372 may include a conductive metal. For example, the electrode layer 372 may include at least one of Al, Ti, In, Au, Ag, ITO, IZO, and indium tin zinc oxide (ITZO). The electrode layer 372 may include a semiconductor material doped with an n- or p-type dopant. The electrode layer 372 may include the same or similar material or different materials, but the disclosure is not limited thereto.

The insulating film 380 may be disposed to surround the outer surfaces of the buffer semiconductor layer 302, the first semiconductor layer 310, the second semiconductor layer 320, the auxiliary layer 371, and the electrode layer 372. In an embodiment, the insulating film 380 may be disposed to surround and protect the outer surfaces of at least the first and second semiconductor layers 310 and 320, disposed on the buffer semiconductor layer 302. For example, the insulating film 380 may be formed to surround the sides of each of the buffer semiconductor layer 302, the first semiconductor layer 310, the second semiconductor layer 320, the auxiliary layer 371, and the electrode layer 372, but to expose portions of the top surfaces of the auxiliary layer 371 and the electrode layer 372.

The light-emitting element 300 may include first and second electrode portions 391 and 392. The first electrode portion 391 may be disposed on the auxiliary layer 371 and may be in contact with a portion or region of the auxiliary layer 371 that may be exposed due to the absence of the insulating film 380. The second electrode portion 392 may be disposed on the electrode layer 372 and may be in contact with a portion or region of the electrode layer 372 that may be exposed due to the absence of the insulating film 380. The first and second electrode portions 391 and 392 may be electrically connected to the first and second electrodes 210 and 220, respectively. The light-emitting element 300 may receive electrical signals from the first and second electrodes 210 and 220 and may emit light of a particular wavelength range in accordance with electrical signals received from the first and second semiconductor layers 310 and 320. The structure and the shape of the light-emitting element 300 are not particularly limited. For example, the light-emitting element 300 may be an LED chip or an LED package.

The light-emitting element 300 may be disposed on the first and second electrodes 210 and 220 to overlap the first transistor T1 of a pixel PX (for example, the first-type pixel PXA). The light-emitting element 300 may be disposed adjacent to the center of the first-type pixel PXA to overlap the first transistor T1 in a thickness direction, but the disclosure is not limited thereto. However, the disclosure is not limited to this, and the location of the light-emitting element 300 may vary depending on the shapes of the semiconductor layers and the conductive layers of the light-emitting element 300 and the first and second electrodes 210 and 220.

The pad electrodes (CP1 and CP2) may be disposed on the electrode conductive layer. The pad electrodes (CP1 and CP2) may include first and second pad electrodes CP1 and CP2, which may be disposed on the first and second electrodes 210 and 220, respectively. The light-emitting element 300 may be in direct contact with the first and second pad electrodes CP1 and CP2 and may thereby be electrically connected to the first and second electrodes 210 and 220. The first and second pad electrodes CP1 and CP2 may be disposed in regions where the electrode conductive layer may be in contact with other elements, to reduce the difference in contact resistance between the electrode conductive layer and the other elements. For example, the first pad electrode CP1 may be disposed to cover or overlap at least a portion or region of the first electrode 210, and the second pad electrode CP2 may be disposed to cover or overlap at least a portion or region of the second electrode 220 (or the wire extension portion VSL-E). In a case where the light-emitting element 300 may be disposed on the first and second electrodes 210 and 220, the pad electrodes (CP1 and CP2) may be disposed between the light-emitting element 300 and the first and second electrodes 220 to reduce the contact resistance between the light-emitting element 300 and the first and second electrodes 220. In an embodiment, the pad electrodes (CP1 and CP2) may include a material such as ITO, IZO, or ITZO, but the disclosure is not limited thereto. In an embodiment, the pad electrodes (CP1 and CP2) may include a metallic material to bond the light-emitting element 300 and the first and second electrodes 210 and 220 together.

The pad electrodes (CP1 and CP2) may cap the first and second electrodes 210 and 220. As a result, the first and second electrodes 210 and 220 may be prevented from being oxidized in an environment where they may be exposed.

Figure 8:
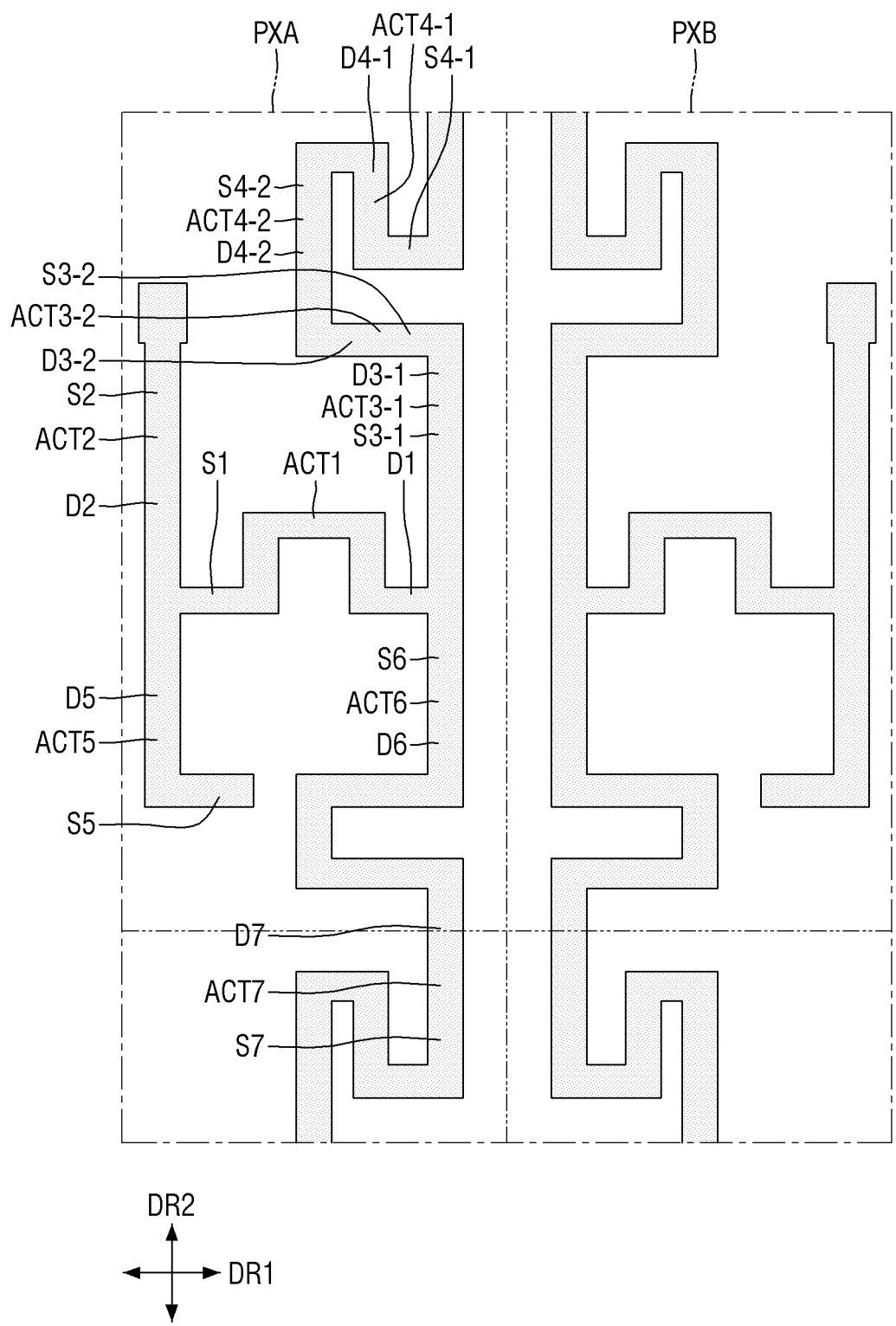
FIG. 8 is a plan view illustrating semiconductor layers disposed in first- and second-type pixels according to an embodiment.
Figure 9:
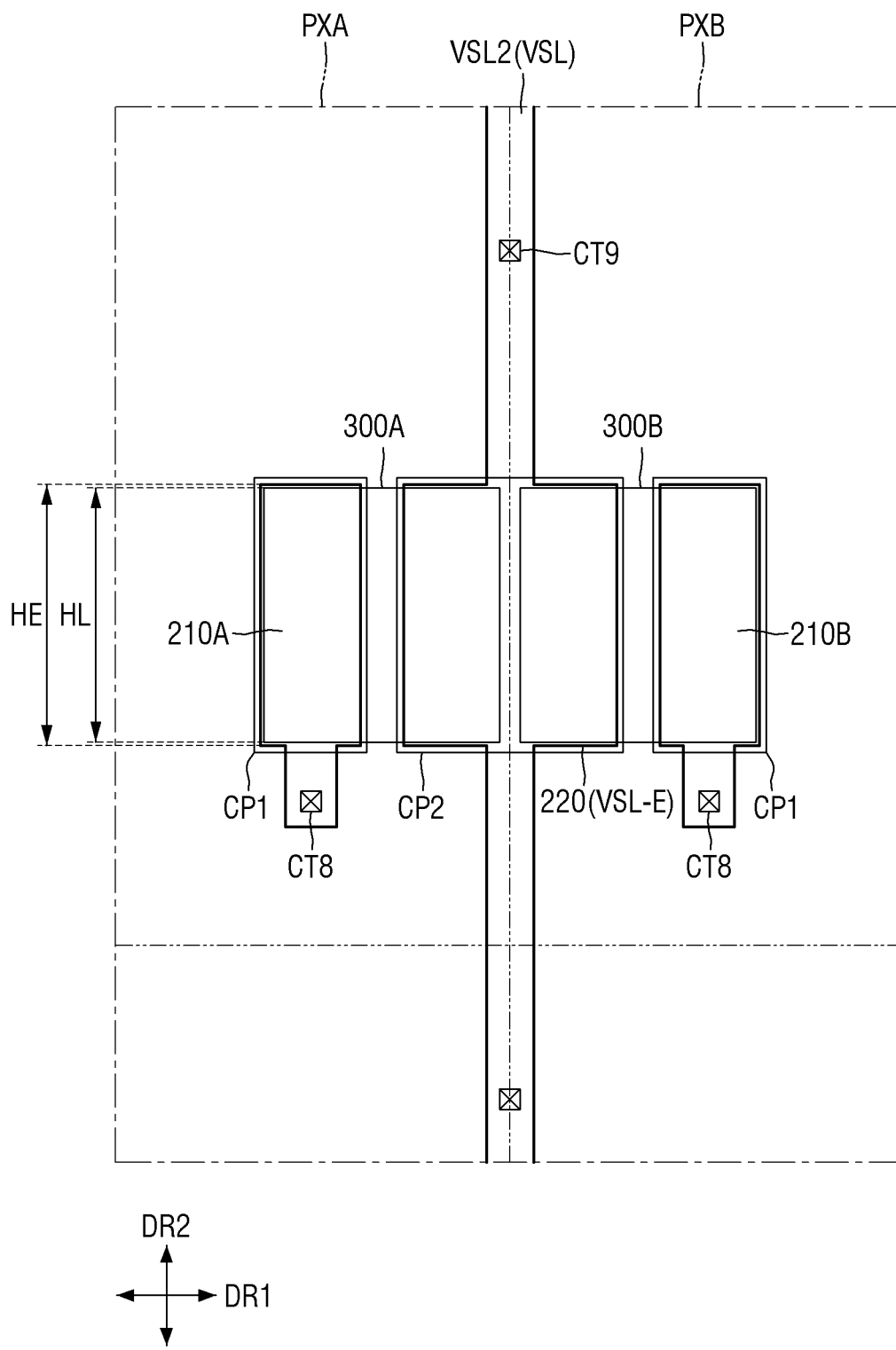
FIG. 9 is a plan view illustrating electrode conductive layers disposed in the first- and second-type pixels of FIG. 8.
Figure 10:
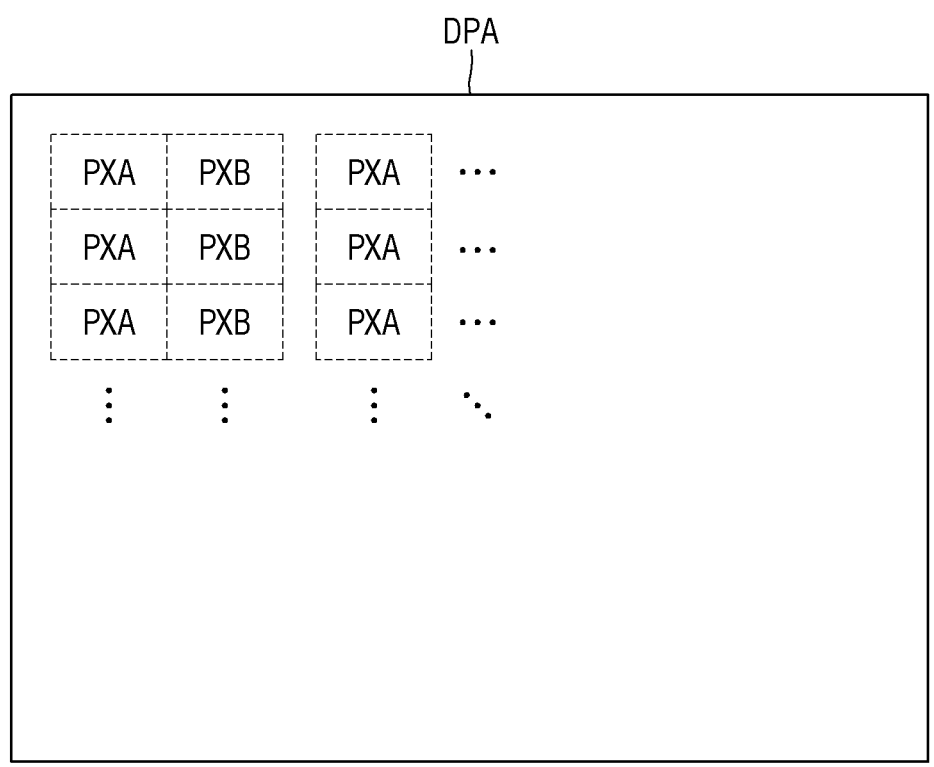
FIG. 10 is a layout view illustrating pixels of the display device of FIG. 1.

FIG. 8 is a plan view illustrating semiconductor layers disposed in first- and second-type pixels according to an embodiment. FIG. 9 is a plan view illustrating electrode conductive layers disposed in the first- and second-type pixels of FIG. 8. FIG. 10 is a layout view illustrating pixels of the display device of FIG. 1.

The arrangement of the first- and second-type pixels PXA and PXB will hereinafter be described with reference to FIGS. 8 through 10. The display device 10 may include the first- and second-type pixels PXA and PXB, which may be of different types. The first- and second-type pixels PXA and PXB may be disposed adjacent to each other, and the second wire VSL2 of the second voltage wire VSL, which may extend in the second direction DR2, may be disposed along the boundary between the first- and second-type pixels PXA and PXB. The first- and second-type pixels PXA and PXB may share the second wire VSL2 disposed therebetween, and the same electrical signal, for example, the second power supply voltage, may be applied to both the first- and second-type pixels PXA and PXB.

In an embodiment, the second wire VSL2 may include the wire extension portion VSL-E, which may be wider than the rest of the second wire VSL2 in the first direction DR1, and the wire extension portion VSL-E (or a second electrode 220 of each of the first- and second-type pixels PXA and PXB) may be disposed in and across the first- and second-type pixels PXA and PXB. The first electrodes 210 of the first- and second-type pixels PXA and PXB, i.e., (1-1)- and (1-2)-th electrodes 210A and 210B of the first- and second-type pixels PXA and PXB, may be disposed to be spaced apart from, and face, each other in the first direction DR1. The (1-1)- and (1-2)-th electrodes 210A and 210B may be arranged or disposed symmetrically in the first direction DR1 with respect to the second wire VSL2.

Pixel circuit elements may be arranged or disposed in each of the pixels PX in accordance with the locations of the first and second electrodes 210 and 220 of the corresponding pixel PX. For example, the location of the eighth contact hole CT8, via which the (1-1)- or (1-2)-th electrode 210A may be electrically connected to the third connecting electrode BE3 of the first- or second-type pixel PXA or PXB, may differ from the first-type pixel PXA to the second-type pixel PXB. The display device 10 may include the second wire VSL2, which may extend in the second direction DR2 along the boundary between the first- and second-type pixels PXA and PXB, and the arrangement of the pixel circuit elements may differ from the first-type pixel PXA to the second-type pixel PXB. The arrangement of semiconductor layers in the first-type pixel PXA, as illustrated in FIG. 7, may be substantially symmetrical with the arrangement of semiconductor layers in the second-type pixel PXB with respect to the second wire VSL2. As illustrated in FIG. 4, data lines DTL, first voltage wires VDL, first connecting electrodes BE1, second connecting electrodes BE2, and third connecting electrodes BE3 may be arranged or disposed symmetrically in the first- and second-type pixels PXA and PXB with respect to the second wire VSL2.

For example, the first voltage wires VDL may be disposed in the first- and second-type pixels PXA and PXB to be spaced apart from each other in the first direction DR1. At least a portion or region of the second voltage wire VSL, for example, the second wire VSL2, may be disposed between the first voltage wires VDL. The first electrodes 210 of the first- and second-type pixels PXA and PXB, for example, the (1-1)- and (1-2)-th electrodes 210A and 210B, may be disposed between the first voltage wires VDL and the second voltage wire VSL, and the wire extension portion VSL-E may have a shape that protrudes toward the (1-1)- and (1-2)-th electrodes 210A and 210B.

In an embodiment, the first- and second-type pixels PXA and PXB may share the second wire VSL2 of the second voltage wire VSL and may thus be arranged or disposed symmetrically with each other, and the distance between the voltage wires VDL may differ from the distance between the light-emitting elements 300 of the first- and second-type pixels PXA and PXB. The first- and second-type pixels PXA and PXB, which may be disposed adjacent to each other, may be symmetrical with respect to the boundary therebetween, and the same elements, for example, light-emitting elements 300, first electrodes 210, and the voltage wires VDL, may be disposed at different locations with respect to the centers of the first- and second-type pixels PXA and PXB. Since the light-emitting elements 300 and the first electrodes 210 of the first- and second-type pixels PXA and PXB may be disposed closer to the second wire VSL2 than to the centers of the first- and second-type pixels PXA and PXB, the distance between the light-emitting elements 300 of the first- and second-type pixels PXA and PXB and the distance between the first electrodes 210 of the first- and second-type pixels PXA and PXB may be smaller than the distance between the first voltage wires VDL.

However, the disclosure is not limited to this. As will be described later, no second wire VSL2 may be provided or disposed between the second-type pixel PXB and another first-type pixel PXA to the right of the second-type pixel PXB. The first voltage wires VDL of the first- and second-type pixels PXA and PXB may be disposed on the opposite sides of the boundary between the first- and second-type pixels PXA and PXB to be spaced apart from each other. The first voltage wire VDL of the second-type pixel PXB and a first voltage wire VDL of the first-type pixel PXA to the right of the second-type pixel PXB may be disposed adjacent to each other.

Referring to FIG. 10, first-type pixels PXA and second-type pixels PXB may be disposed to be adjacent in the first direction DR1. The first-type pixels PXA may be arranged or disposed side-by-side in the second direction DR2, and the second-type pixels PXB may also be arranged or disposed side-by-side in the second direction DR2. Pixels PX belonging to the same column (for example, the same line in the second direction DR2) may be of the same type. First-type pixels PXA in a first column and second-type pixels PXB in a second column may be disposed adjacent to each other and may share a second wire (VSL2 of FIG. 8) disposed therebetween. On the contrary, the second-type pixels PXB in the second column and first-type pixels PXA in a third column may be disposed adjacent to each other, but may not have a second wire VSL2 disposed therebetween. Although not illustrated, the first-type pixels PXA in the third column may share a second wire VSL2 with second-type pixels PXB in a fourth column, but the disclosure is not limited thereto. Alternatively, a second wire VSL2 may be provided or disposed between the second-type pixels PXB in the second column and the first-type pixels PXA in the third column.

Since the first-type pixels PXA and the second-type pixels PXB may share the same second wire(s) VSL2, the number of second wires VSL2 provided or disposed on the entire surface of the display area DPA may be reduced. As a result, space for other elements may be secured in the electrode conductive layer for each pixel PX. The display device 10 may have, in each pixel PX, first and second electrodes 210 and 220 with relatively large widths and may thus be able to effectively release heat generated by light-emitting elements 300.

Referring to FIG. 9, the (1-1)- and (1-2)-th electrodes 210A and 210B and the second electrode 220 may each be formed to have a predetermined width in the first direction DR1 and to have a first length HE in the second direction DR2. The (1-1)- and (1-2)-th electrodes 210A and 210B and the second electrode 220 may have the same length, for example, the first length HE, but the disclosure is not limited thereto. Alternatively, the length of the (1-1)- and (1-2)-th electrodes 210A and 210B may be greater than the length of the second electrode 220, or vice versa.

Light-emitting elements 300A and 300B of the first- and second-type pixels PXA and PXB may be disposed on the (1-1)- and (1-2)-th electrodes 210A and 210B, respectively, and on the second electrode 220. In an embodiment, a second length HL, in the second direction DR2, of the light-emitting elements 300A and 300B may be smaller than the first length HE, in the second direction DR2, of the (1-1)- and (1-2)-th electrodes 210A and 210B. The width, in the first direction DR1, of the (1-1)- and (1-2)-th electrodes 210A and 210B may be smaller than the width, in the first direction DR1, of the light-emitting elements 300A and 300B, but the first length HE, in the second direction DR2, of the (1-1)- and (1-2)-th electrodes 210A and 210 may be greater than the second length HL, in the second direction DR2, of the light-emitting elements 300A and 300B. The light-emitting elements 300A and 300B may be disposed to almost entirely overlap the (1-1)- and (1-2)-th electrodes 210A and 210, respectively, and with the second electrode 220, and the (1-1)- and (1-2)-th electrodes 210A and 210 and the second electrode 220 may include a material with high thermal conductivity and may thus be able to effectively release heat generated by the light-emitting elements 300A and 300B.

Display devices according to other embodiments will hereinafter be described with reference to FIGS. 11 through 18.

Figure 11:
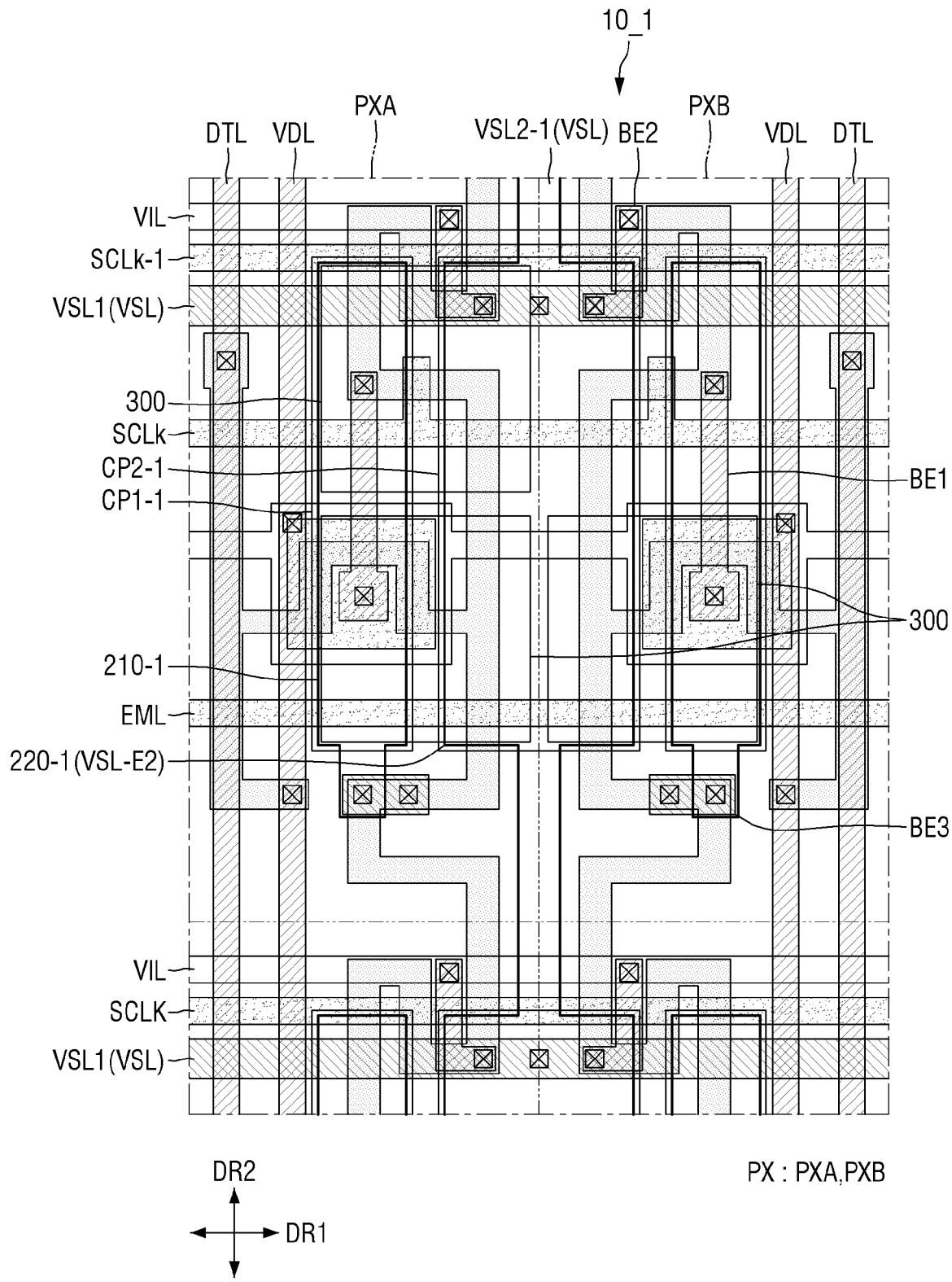
FIG. 11 is a layout view illustrating a portion or a region of a display area of a display device according to an embodiment, including first- and second-type pixels.

FIG. 11 is a layout view illustrating a portion or region of a display area of a display device according to an embodiment, including first- and second-type pixels.

Referring to a display device 10_1 of FIG. 11, first electrodes 210-1 and a second electrode 220-1 may have a large length in a second direction DR2. The first electrodes 210-1 and the second electrode 220-1 may have a different first length (HE of FIG. 8) from the first electrodes 210 and the second electrode 220 of FIG. 4. An embodiment of FIG. 11 will hereinafter be described, focusing mainly on the differences with the embodiment of FIG. 4.

The first electrodes 210-1 and the second electrode 220-1 may have a large length in the second direction DR2. First pad electrodes CP1-1 and a second pad electrode CP2-1 may also have a large length in the second direction DR2. Since the first electrodes 210-1 and the second electrode 220-1 may be elongated in the second direction DR2, the heat dissipation efficiency for heat generated by light-emitting elements 300 may be enhanced, and at the same time, the number of light-emitting elements 300 that may be provided or disposed in each of first- and second-type pixels PXA and PXB may be increased.

In an embodiment, the second-type pixel PXB may include a dummy electrode portion where light-emitting elements 300 may yet to be disposed on the first electrodes 210-1 and the second electrode 220-1 of the second-type pixel PXB. If the light-emitting element 300 disposed on the first electrodes 210-1 and the second electrode 220-1 of the second-type pixel PXB is defective, an additional light-emitting element 300 may be disposed in the dummy electrode portion of the second-type pixel PXB so that an emission defect in the second-type pixel PXB may be addressed. For example, the dummy electrode portion of the second-type pixel PXB may function as a repair electrode.

Figure 12:
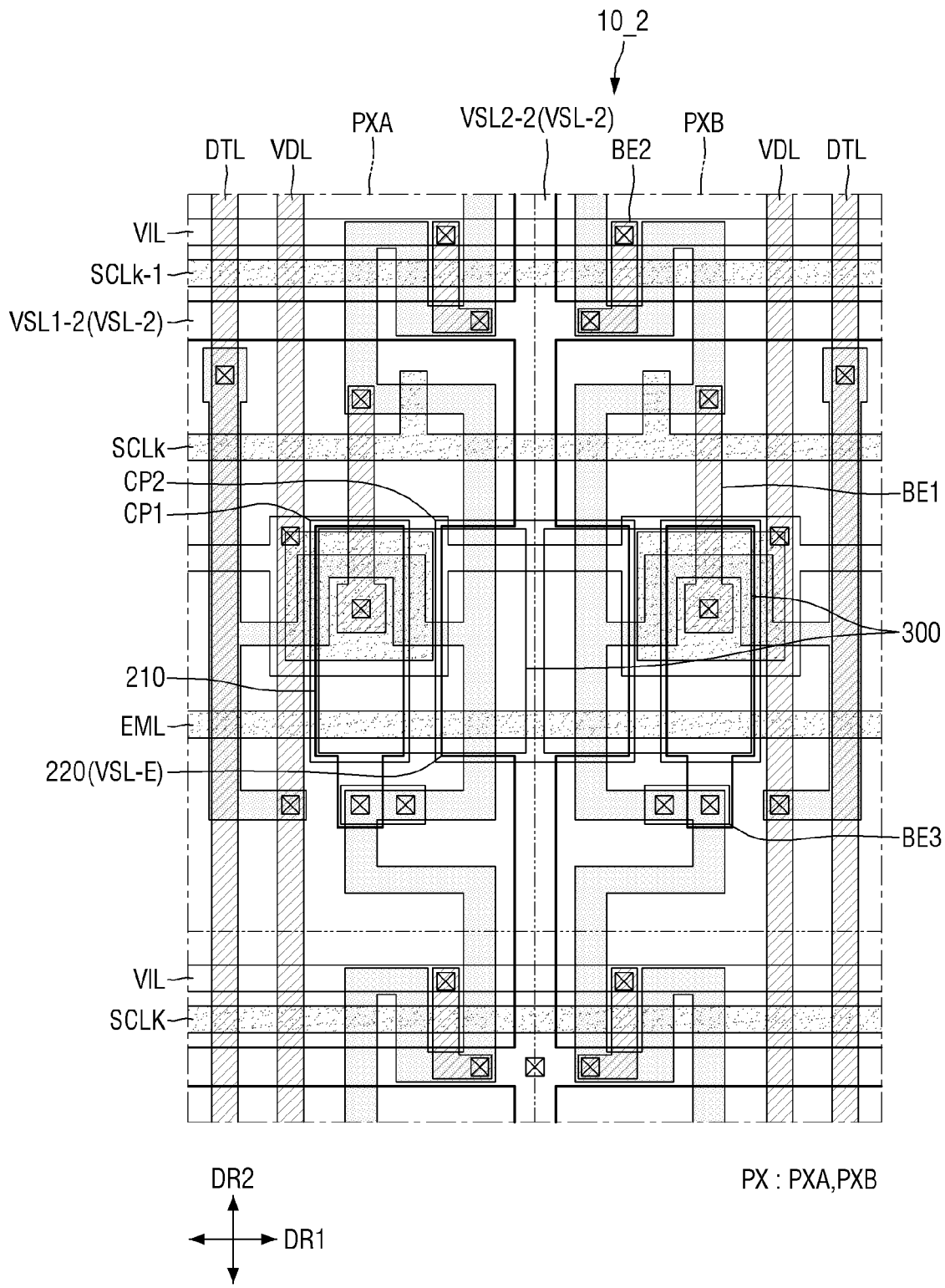
FIG. 12 is a layout view illustrating a portion or a region of a display area of a display device according to an embodiment, including first- and second-type pixels.

FIG. 12 is a layout view illustrating a portion or region of a display area of a display device according to an embodiment, including first- and second-type pixels.

Referring to a display device 102 of FIG. 12, a first wire VSL1-2 of a second voltage wire VSL_2 may be disposed in an electrode conductive layer. Third connecting electrodes BE3 or only third connecting electrodes BE3 may be disposed in a second data conductive layer, and the first wire VSL1-2 may be disposed on a first planarization layer 109 so that a second wire VSL2-2 of the second voltage wire VSL_2 may be integrally formed with the first wire VSL1-2. An embodiment of FIG. 12 may differ from the embodiment of FIG. 4 in terms of the arrangement of the second voltage wire VSL-2. An embodiment of FIG. 12 will hereinafter be described, focusing mainly on the differences with the embodiment of FIG. 4.

As previously described above, the first wire VSL1-2 of the second voltage wire VSL-2 may be disposed on the first planarization layer 109. The first wire VSL1-2 may extend in a first direction DR1 over the first planarization layer 109, and the second wire VSL2-2 may extend in a second direction DR2 to intersect the first wire VSL1-2. Ninth contact holes CT9, which may penetrate the first planarization layer 109, may not be provided or disposed in the display device 10_2. The second voltage wire VSL-2 may be disposed in an entire display area DPA in a lattice or mesh shape. In this case, since the area occupied by the electrode conductive layer, which may be disposed on the first planarization layer 109 increases, the widths and lengths of first electrodes 210 and a second electrode 220 may be limited. However, by including other layers in a second data conductive layer, the heat dissipation efficiency of pixel circuit elements may be improved.

If the third connecting electrodes BE3 may be disposed in a first data conductive layer, the second data conductive layer may not be provided.

Figure 13:
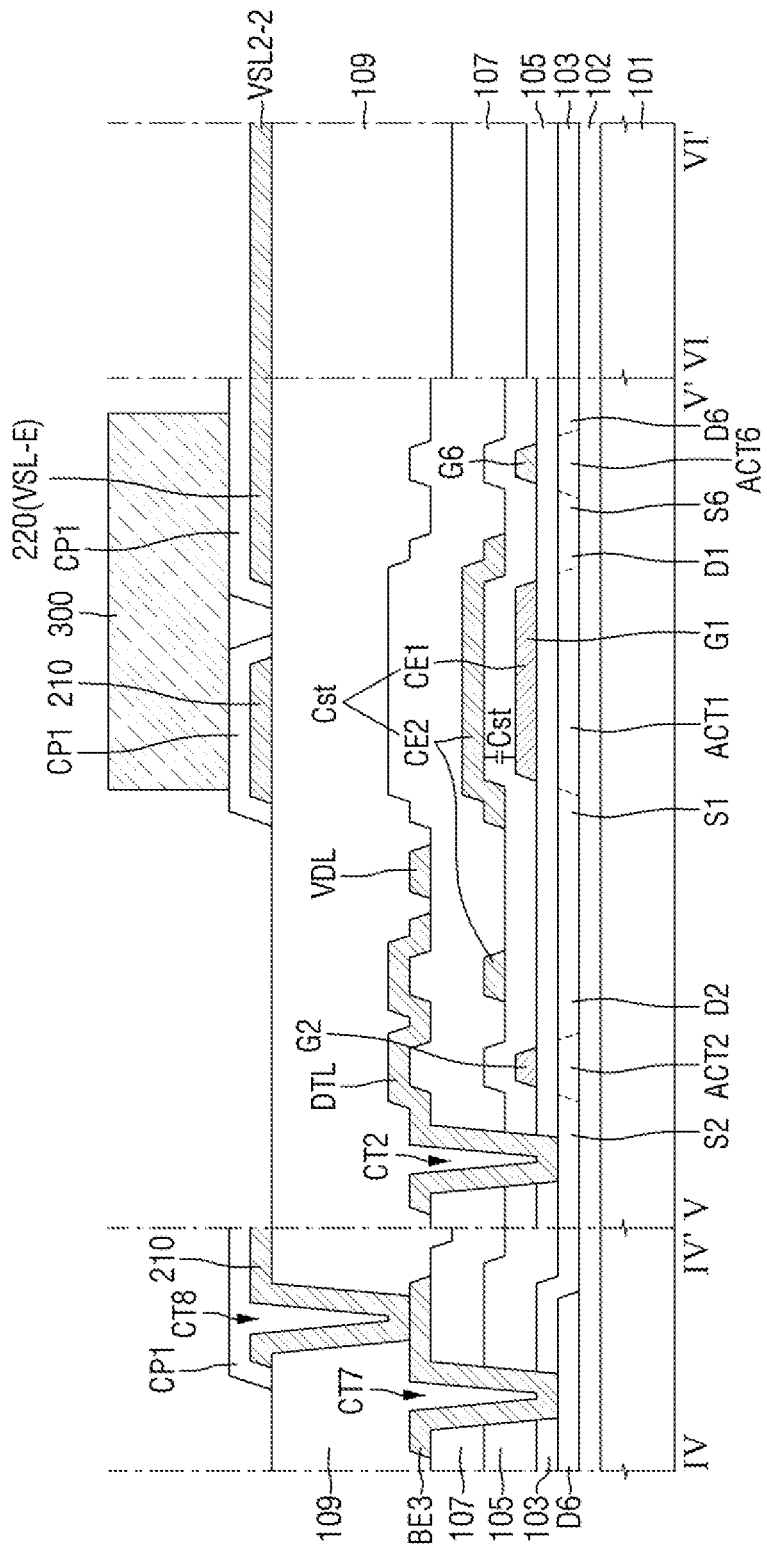
FIG. 13 is a schematic cross-sectional view illustrating a portion or a region of a display device according to an embodiment.

FIG. 13 is a schematic cross-sectional view illustrating a portion or region of a display device according to an embodiment.

Referring to FIG. 13, a first wire of a second voltage wire VSL_2 may be disposed in an electrode conductive layer, and a third connecting electrode BE3 may be disposed in a first data conductive layer. Accordingly, a third interlayer insulating layer 108 and a second data conductive layer may not be provided, and a first planarization layer 109 may be disposed directly on the first data conductive layer. An embodiment of FIG. 13 may differ from the embodiment of FIG. 6 in that the second data conductive layer may not be provided, and a further detailed description of the embodiment of FIG. 13 will be omitted.

Figure 14:
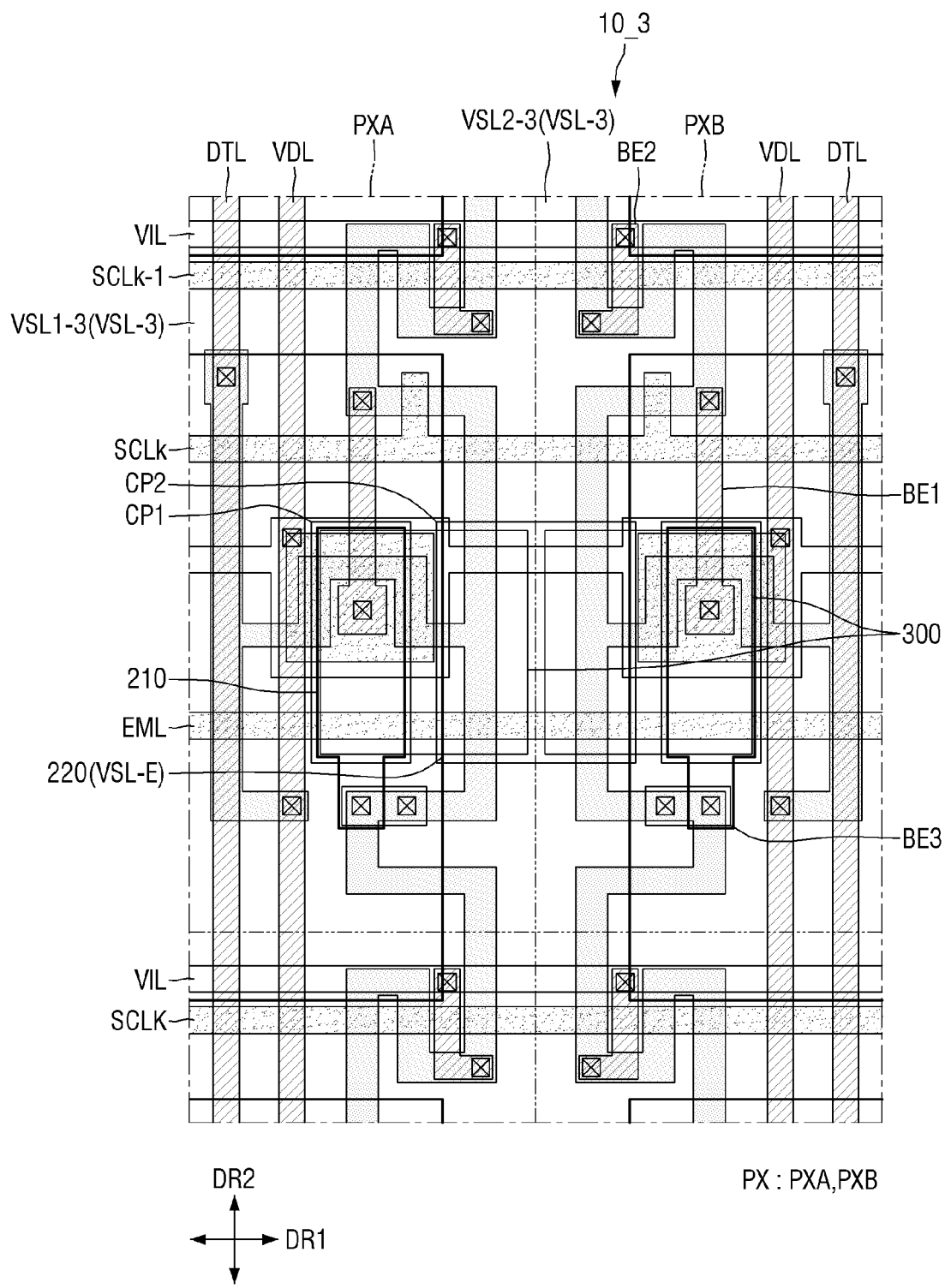
FIG. 14 is a layout view illustrating a portion or a region of a display area of a display device according to an embodiment, including first- and second-type pixels.

FIG. 14 is a layout view illustrating a portion or region of a display area of a display device according to an embodiment, including first- and second-type pixels.

Referring to a display device 10_3 of FIG. 14, first and second wires VSL1_3 and VSL2-3 of a second voltage wire VSL_3 may have relatively large widths. The second wire VSL-3 may have the same or similar width as a wire extension portion VSL-E. As described above with reference to FIG. 12, the widths and lengths of first electrodes 210 and a second electrode 220 may be limited due to an increase in the number of elements disposed on a first planarization layer 109, but by increasing the width of the second wire VSL2-3, the heat dissipation efficiency for heat generated by light-emitting elements 300 may be further enhanced. A further detailed description of the embodiment of FIG. 14 will be omitted.

Figure 15:
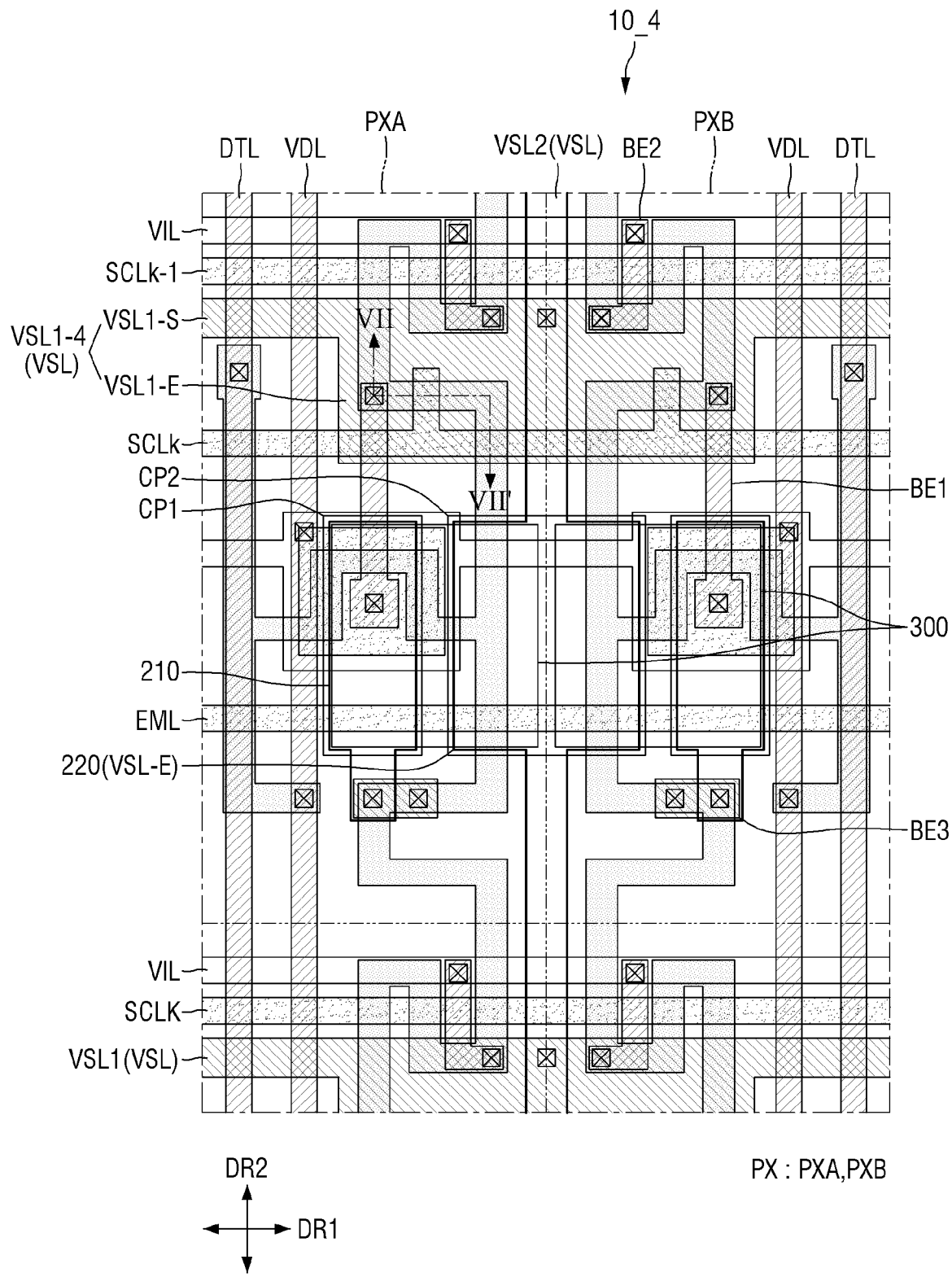
FIG. 15 is a layout view illustrating a portion or a region of a display area of a display device according to an embodiment, including first- and second-type pixels.
Figure 16:
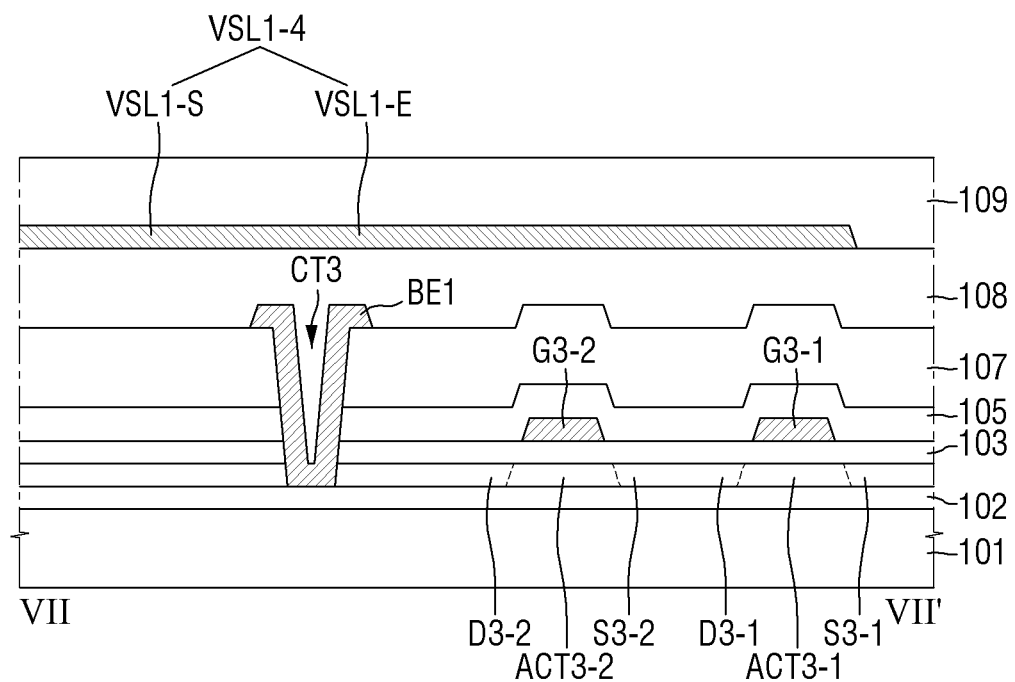
FIG. 16 is a schematic cross-sectional view taken along line VII-VII' of FIG. 15.

FIG. 15 is a layout view illustrating a portion or region of a display area of a display device according to an embodiment, including first- and second-type pixels. FIG. 16 is a schematic cross-sectional view taken along line VII-VII' of FIG. 15.

Referring to a display device 104 of FIGS. 15 and 16, a first wire VSL1-4 of a second voltage wire VSL may include a wire stem portion VSL1-S and a wire extension portion VSL1-E. An embodiment of FIGS. 15 and 16 may differ from the embodiment of FIG. 4 in that the first wire VSL1-4 may include the wire extension portion VSL1-E having a relatively large width. An embodiment of FIGS. 15 and 16 will hereinafter be described, focusing mainly on the differences with the embodiment of FIG. 4.

The wire extension portion VSL1-E may have a larger width than the wire stem portion VSL1-S and may be disposed to overlap semiconductor layers disposed therebelow. The width, in a second direction DR2, of the wire extension portion VSL1-E may be greater than the width, in the second direction DR2, of the wire stem portion VSL1-S, and the wire extension portion VSL1-E may have a predetermined length in a first direction DR1, for example, in the direction in which the first wire VSL1-4 extends. The wire extension portion VSL1-E may be disposed to extend from a first-type pixel PXA to a second-type pixel PXB, and the first- and second-type pixels PXA and PXB may share the wire extension portion VSL1-E. However, the disclosure is not limited thereto.

In the display device 10_4, heat may be generated not only by light-emitting elements 300, but also by pixel circuit elements. The display device 10_4 may include a heat dissipation pattern disposed in a first gate conductive layer, a second gate conductive layer, or a second data conductive layer and may thus be able to effectively release heat generated by pixel circuit elements.

For example, the first wire VSL1-4 of the second voltage wire VSL may include the wire stem portion VSL1-S and the wire extension portion VSL1-E, and the wire extension portion VSL1-E may function as a heat dissipation pattern. The wire extension portion VSL1-E may be disposed to overlap at least one of first through seventh transistors T1 through T7 of each of the first- and second-type pixels PXA and PXB in a thickness direction and may release heat generated by the transistors of which it may overlap.

In an embodiment, since the wire extension portion VSL1-E may overlap its underlying transistors, the wire extension portion VSL1-E may prevent external light from being incident upon its underlying transistors. For example, the wire extension portion VSL1-E may function as a shielding member for reflecting external light.

In an embodiment, the wire extension portion VSL1-E may be disposed to overlap portions of at least the third transistor T3 of each of the first- and second-type pixels PXA and PXB. The third transistors T3 of the first- and second-type pixels PXA and PXB may be disposed between the first wire VSL1-4 and the first transistors T1 of the first- and second-type pixels PXA and PXB. The wire extension portion VSL1-E may include (3-1)- and (3-2)-th active regions ACT3-1 and ACT3-2 of (3-1)- and (3-2)-th transistors T3-1 and T3-2 of each of the first- and second-type pixels PXA and PXB and may be disposed to overlap (3-1)- and (3-2)-th source regions S3-1 and S3-2 and/or (3-1)- and (3-2)-th drain regions D3-1 and D3-2 of each of the first- and second-type pixels PXA and PXB. FIG. 16 illustrates that the wire extension portion VSL1-E may overlap entirely with the (3-1)- and (3-2)-th transistors T3-1 and T3-2 of each of the first- and second-type pixels PXA and PXB, but the disclosure is not limited thereto.

The wire extension portion VSL1-E may prevent the third transistors T3 of the first- and second-type pixels PXA and PXB from being affected by external light and/or electrical signals. For example, the wire extension portion VSL1-E may improve the operating characteristics of pixel circuit elements of each of the first- and second-type pixels PXA and PXB.

The wire extension portion VSL1-E may not necessarily be disposed to prevent external light from being incident upon the third transistors T3 of the first- and second-type pixels PXA and PXB. In an embodiment, the display device 10_4 may include shielding members, which may not be electrically connected to other elements of the display device 10_4 to prevent external light from being incident upon the transistors of each of the first- and second-type pixels PXA and PXB.

Figure 17:
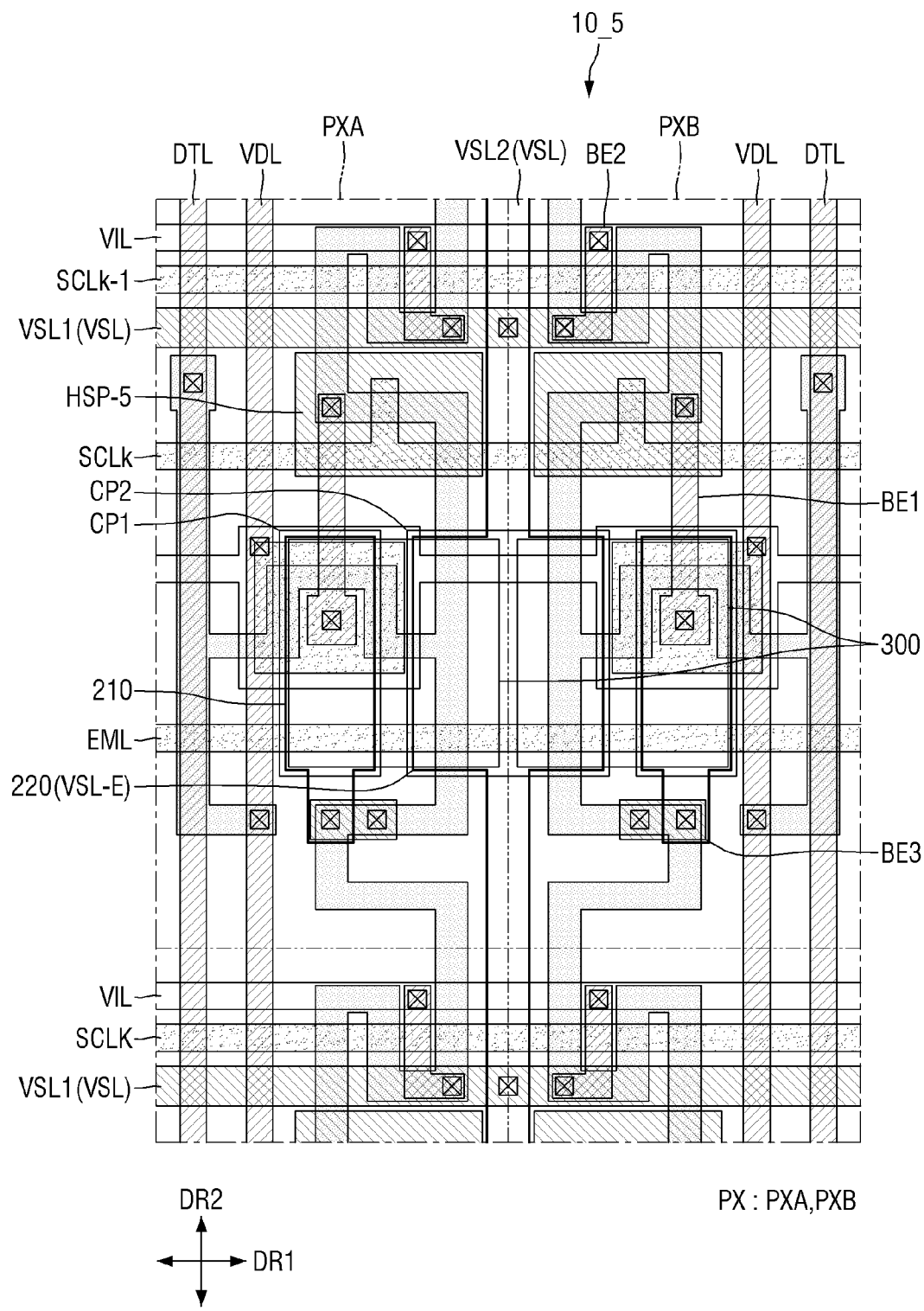
FIG. 17 is a layout view illustrating a portion or a region of a display area of a display device according to an embodiment, including first- and second-type pixels.

FIG. 17 is a layout view illustrating a portion or region of a display area of a display device according to an embodiment, including first- and second-type pixels.

Referring to FIG. 17, a display device 10_5 may include shielding members HSP-5, which may overlap third transistors T3 of first- and second-type pixels PXA and PXB in a thickness direction. In the display device 10_5 of FIG. 17, different from in the display device 10_4 of FIG. 15, the shielding members HSP-5 may be disposed in a second data conductive layer to be spaced apart from a first wire VSL1 of a second voltage wire VSL. For example, the shielding members HSP-5 may be floating electrodes to which electrical signals may not be transmitted, but the disclosure is not limited thereto. Alternatively, the shielding members HSP-5, which may prevent external light from being incident upon the third transistors T3 of the first- and second-type pixels PXA and PXB, may be electrically connected to voltage wires.

Figure 18:
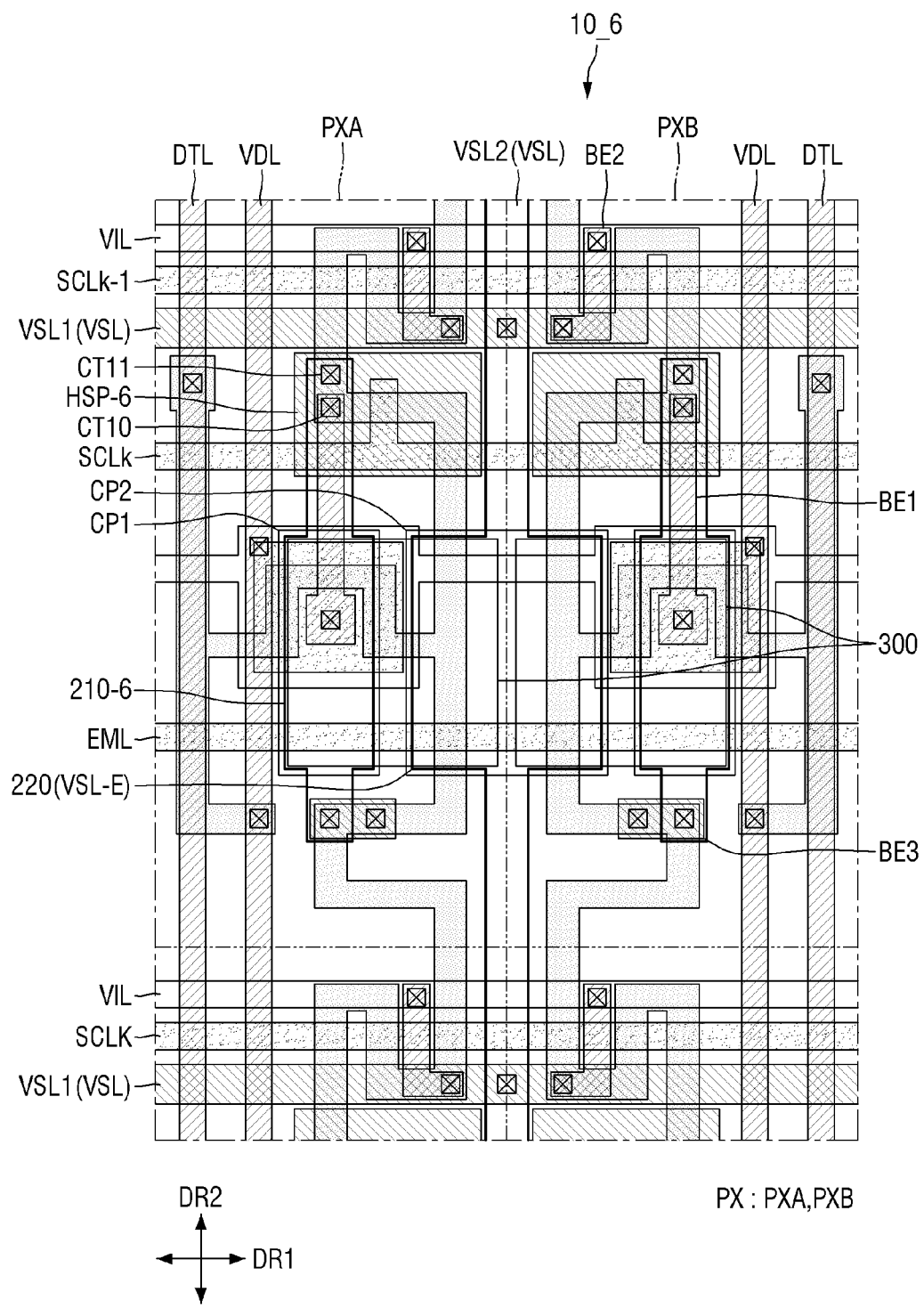
FIG. 18 is a layout view illustrating a portion or a region of a display area of a display device according to an embodiment, including first- and second-type pixels.

FIG. 18 is a layout view illustrating a portion or region of a display area of a display device according to an embodiment, including first- and second-type pixels.

Referring to a display device 10_6 of FIG. 18, shielding members HSP-6 may be electrically connected to first electrodes 210-6, and a first power supply voltage, applied to the first electrodes 210-6, may be transmitted to the shielding members HSP-6. The first electrodes 210-6 may include portions that extend in a second direction DR2 to overlap the shielding members HSP-6 and may be electrically connected to the shielding members HSP-6 via eleventh contact holes CT11, but the disclosure is not limited thereto. Alternatively, in an embodiment, the shielding members HSP-6 may be electrically connected to an initialization voltage wire VIL so that an initialization voltage may be transmitted to the shielding members HSP-6. A further description of the embodiment of FIG. 18 will be omitted.

In concluding the detailed description, those skilled in the art will appreciate that many variations and modifications may be made to the described embodiments without substantially departing from the principles of the disclosure. Therefore, the disclosed embodiments are used in a generic and descriptive sense only and not for purposes of limitation.

What is claimed is:

1. A display device comprising:
   a first pixel and a second pixel disposed adjacent to each other in a first direction;
   first voltage wires disposed in the first pixel and the second pixel, the first voltage wires extending in a second direction crossing the first direction;
   a second wire disposed along a boundary between the first pixel and the second pixel in the second direction;
   first electrodes disposed between the first voltage wires and the second wire in the first pixel and the second pixel;
   a second electrode disposed between and spaced apart from the first electrodes in the first pixel and the second pixel; and
   light-emitting elements disposed at each of the first pixel and the second pixel and disposed on the first electrodes and the second electrode not to be interposed between the first electrodes and the second electrode in a thickness direction,
   wherein the first voltage wires, the first electrodes, and the light-emitting elements are symmetric with respect to the second wire.

2. The display device of claim 1, wherein
   the first pixel and the second pixel include first transistors overlapping the light-emitting elements in a thickness direction, and
   the first transistors are symmetric with respect to the second wire.

3. The display device of claim 1, wherein a distance between the light-emitting elements differs from a distance between the first voltage wires.

4. The display device of claim 3, further comprising:
   data lines disposed in the first pixel and the second pixel and extending in the second direction,
   wherein the first voltage wires are disposed between the data lines and the second wire.

5. The display device of claim 4, wherein the first pixel and the second pixel include second transistors electrically connected to the data lines.

6. The display device of claim 1, further comprising:
a first wire extending in the first direction across the first pixel and the second pixel
wherein the second wire extending in the second direction to intersect the first wire.

7. The display device of claim 6, wherein
at least part of the second wire protrudes toward the first electrode of the first pixel and the first electrode of the second pixel, and overlaps a portion of the second electrode, and
the first wire and the second wire are disposed in different layers and electrically connected via a contact hole formed in an overlapping portion of the first wire and the second wire.

8. The display device of claim 6, wherein the first pixel and the second pixel include third transistors disposed between the first wire and the first transistors.

9. The display device of claim 6, wherein
the first wire includes:
a wire stem portion; and
a wire extension portion protruding in the second direction beyond the wire stem portion, and
the wire extension portion overlaps the third transistors in a thickness direction.

10. The display device of claim 8, further comprising:
a shielding member spaced apart from the first wire and overlapping the third transistors in a thickness direction,
wherein the shielding member and the first wire are disposed on a same layer.

11. The display device of claim 10, wherein the first electrodes are electrically connected to the shielding member.

12. The display device of claim 1, wherein
the first electrodes and the second electrode extend in the second direction, and
lengths of the first electrodes and the second electrode in the second direction are greater than a length of the light-emitting elements in the second direction.

13. The display device of claim 12, wherein a number of light-emitting elements disposed on the first and second electrodes of the first pixel is greater than a number of light-emitting elements disposed on the first and second electrodes of the second pixel.

14. The display device of claim 1, further comprising:
first pad electrodes disposed on the first electrodes; and
a second pad electrode disposed on the second electrode,
wherein the light-emitting elements are in contact with the first pad electrodes and the second pad electrode.

15. The display device of claim 1, wherein the light emitting elements are electrically connected to the second wire.

16. The display device of claim 1, wherein the first electrodes and the second electrode being formed from a same layer and including a same material.

17. A display device comprising:
first voltage wires spaced apart from one another in a first direction and extending in a second direction;
a second voltage wire disposed between the first voltage wires to extend in the second direction;
first electrodes disposed between the second voltage wire and the first voltage wires;
a wire extension portion spaced apart from the first electrodes, the wire extension portion being at least a portion of the second voltage wire protruding toward the first electrodes; and
light-emitting elements disposed on the first electrodes and disposed on the wire extension portion, the light emitting elements being electrically connected to the second voltage wire,
wherein a distance between the light-emitting elements differs from a distance between the first voltage wires.

18. The display device of claim 17, wherein the second voltage wire includes:
a first wire extending in the first direction; and
a second wire extending in the second direction to intersect the first wire, and
the wire extension portion is formed in the second wire.

19. The display device of claim 18, wherein a length of the wire extension portion in the second direction is same as a length of the first electrodes in the second direction.

20. The display device of claim 19, further comprising:
first pad electrodes disposed on the first electrodes; and
a second pad electrode disposed on the wire extension portion,
wherein the light-emitting elements directly contact the first pad electrodes and the second pad electrode.

21. The display device of claim 18, wherein the first wire and the second wire are disposed in different layers and electrically connected via a contact hole formed in an overlapping portion of the first wire and the second wire.

22. The display device of claim 18, wherein the first wire and the second wire are disposed on a same layer.

23. The display device of claim 17, wherein
the second voltage wire and the wire extension portion being integrally formed and being of a same layer, and
each of the light emitting elements includes first and second ends electrically connected to the first electrodes and the wire extension portion respectively.

* * * * *